US011349058B2

(12) United States Patent
Larsson et al.

(10) Patent No.: US 11,349,058 B2
(45) Date of Patent: May 31, 2022

(54) THERMOELECTRIC HALF-CELL AND METHOD OF PRODUCTION

(71) Applicant: TEGMA AS, Kristiansand (NO)

(72) Inventors: Andreas Larsson, Lier (NO); Torleif A Tollefsen, Drammen (NO)

(73) Assignee: TEGMA AS, Asker (NO)

( * ) Notice: Subject to any disclaimer, the term of this patent is extended or adjusted under 35 U.S.C. 154(b) by 0 days.

(21) Appl. No.: 16/078,317

(22) PCT Filed: Feb. 17, 2017

(86) PCT No.: PCT/EP2017/053684
§ 371 (c)(1),
(2) Date: Aug. 21, 2018

(87) PCT Pub. No.: WO2017/144373
PCT Pub. Date: Aug. 31, 2017

(65) Prior Publication Data
US 2019/0051808 A1 Feb. 14, 2019

(30) Foreign Application Priority Data

Feb. 22, 2016 (NO) .................................. 20160298

(51) Int. Cl.
*H01L 35/08* (2006.01)
*H01L 35/32* (2006.01)
*H01L 35/18* (2006.01)
*H01L 35/22* (2006.01)
*H01L 35/34* (2006.01)

(52) U.S. Cl.
CPC .............. *H01L 35/34* (2013.01); *H01L 35/08* (2013.01); *H01L 35/18* (2013.01); *H01L 35/22* (2013.01); *H01L 35/32* (2013.01)

(58) Field of Classification Search
None
See application file for complete search history.

(56) References Cited

U.S. PATENT DOCUMENTS

| 3,607,444 | A | * | 9/1971 | DeBucs | .................. | F25B 21/02 136/208 |
| 5,429,680 | A | | 7/1995 | Fuschetti | | |
| 7,834,263 | B2 | * | 11/2010 | DeSteese | ................ | H01L 35/34 136/205 |
| 2007/0227158 | A1 | * | 10/2007 | Kuchimachi | ........... | H01L 35/32 62/3.7 |

(Continued)

FOREIGN PATENT DOCUMENTS

| JP | 09-321354 | 12/1997 |
| JP | 09-321356 | 12/1997 |
| JP | 2013-201382 | 10/2013 |

OTHER PUBLICATIONS

International Search Report dated Apr. 5, 2017 in International (PCT) Application No. PCT/EP2017/053684.

(Continued)

*Primary Examiner* — Tamir Ayad
(74) *Attorney, Agent, or Firm* — Wenderoth, Lind & Ponack, L.L.P.

(57) ABSTRACT

The present invention relates to a method for manufacturing a thermoelectric half-cell which utilises the metallization for obtaining both the electric and thermal contact required to form a functional thermoelectric cell.

12 Claims, 10 Drawing Sheets

(56) References Cited

U.S. PATENT DOCUMENTS

| | | | |
|---|---|---|---|
| 2008/0163916 A1* | 7/2008 | Tsuneoka | H01L 35/32 |
| | | | 136/203 |
| 2012/0017963 A1* | 1/2012 | Stefan | H01L 35/32 |
| | | | 136/203 |
| 2013/0152990 A1 | 6/2013 | Lai et al. | |
| 2014/0230875 A1 | 8/2014 | Angermann et al. | |
| 2017/0365765 A1* | 12/2017 | Tollefsen | H01L 35/34 |
| 2018/0323358 A1* | 11/2018 | Tollefsen | B23K 35/262 |

OTHER PUBLICATIONS

Search Report dated Sep. 22, 2016 in Norwegian Application No. 20160298.

Nemoto et al., "Power Generation Characteristics of $Mg_2Si$ Uni-Leg Thermoelecuic Generator", Journal of Electronic Materials, vol. 41, No. 6, Feb. 25, 2012, pp. 1312-1316, XP035057907.

Larsson et al., "Ni—Sn solid-liquid interdiffusion (SLID) bonding for thermo-electric elements in extreme environments—FEA of the joint stress", European Microelectronics Packaging Conference (EMPC), Sep. 14, 2015, pp. 1-6, XP032854708.

\* cited by examiner

Figure 1:
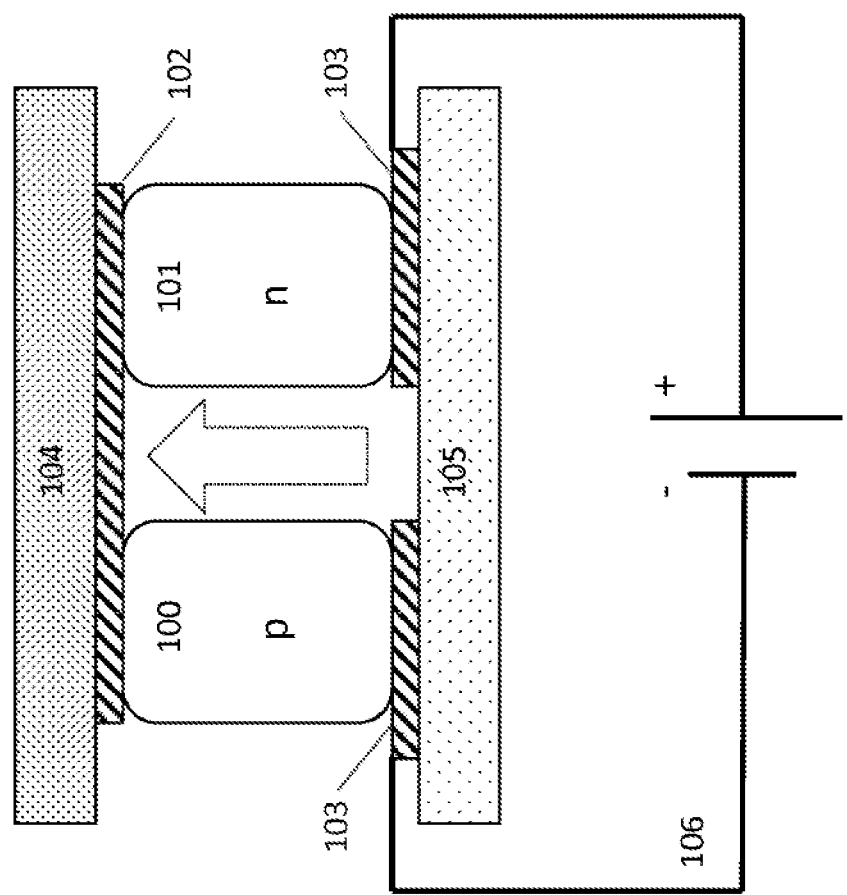

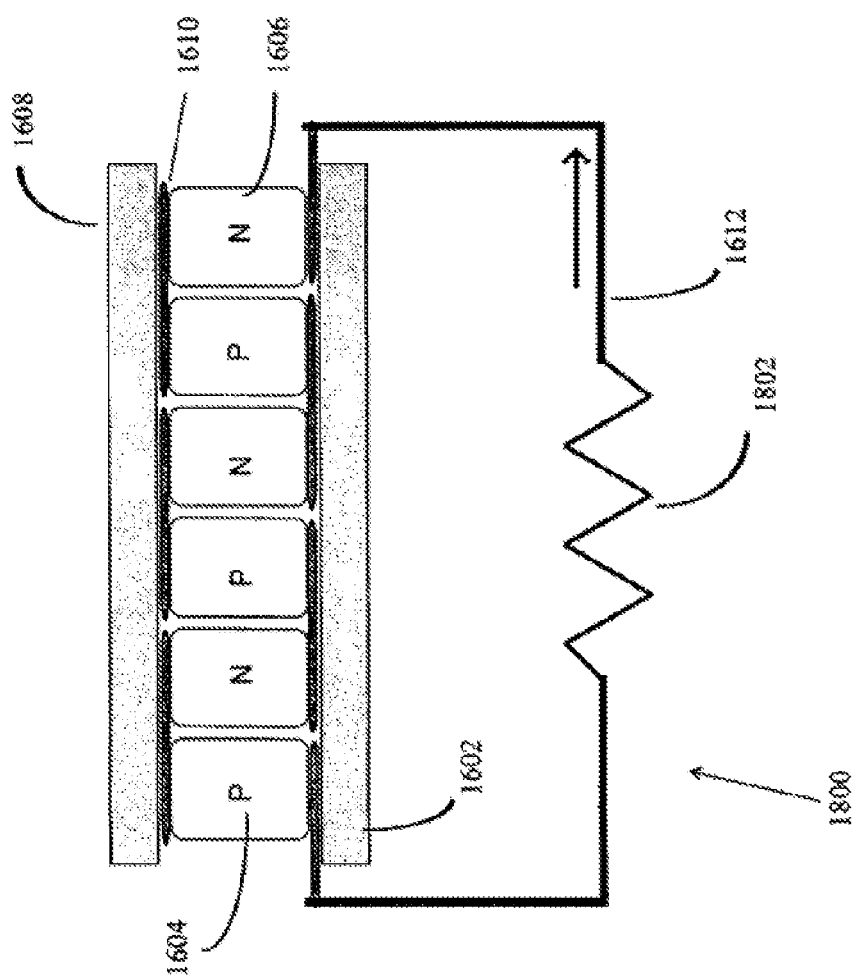
Figure 1 b) Excerpt from Fig. 18 of US 6 660 926

Figure 2:
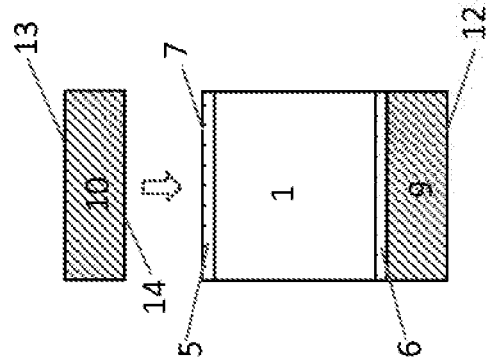
Figure 2:
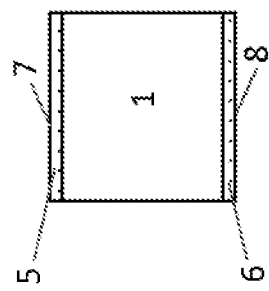
Figure 2:
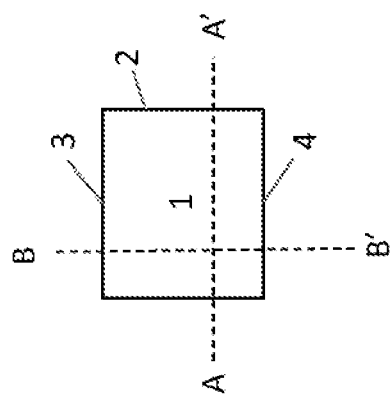
Figure 2:
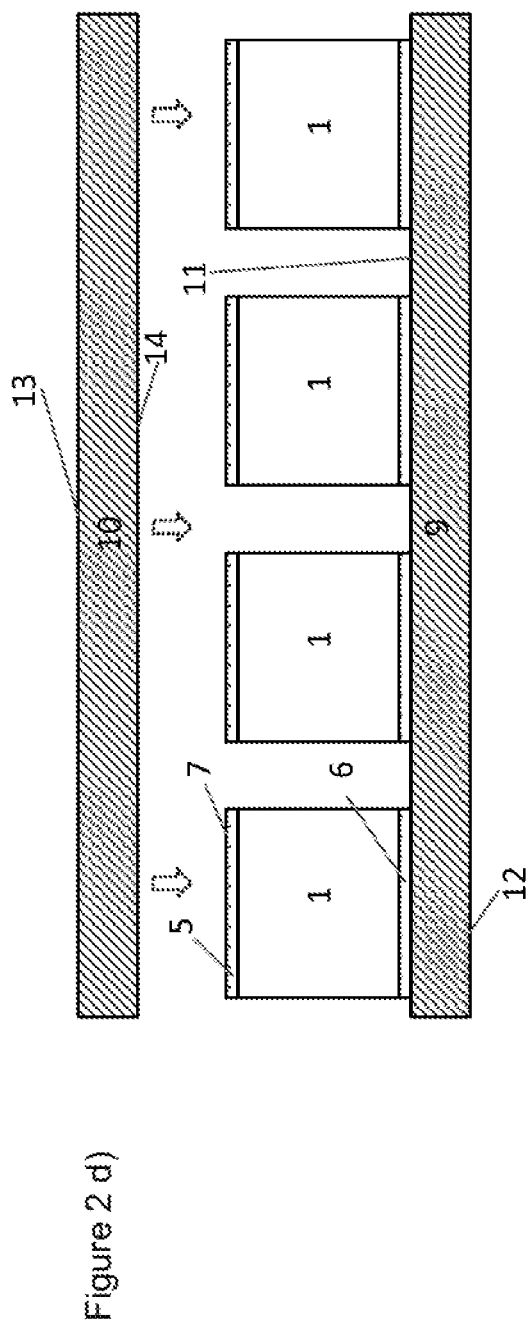
Figure 2:
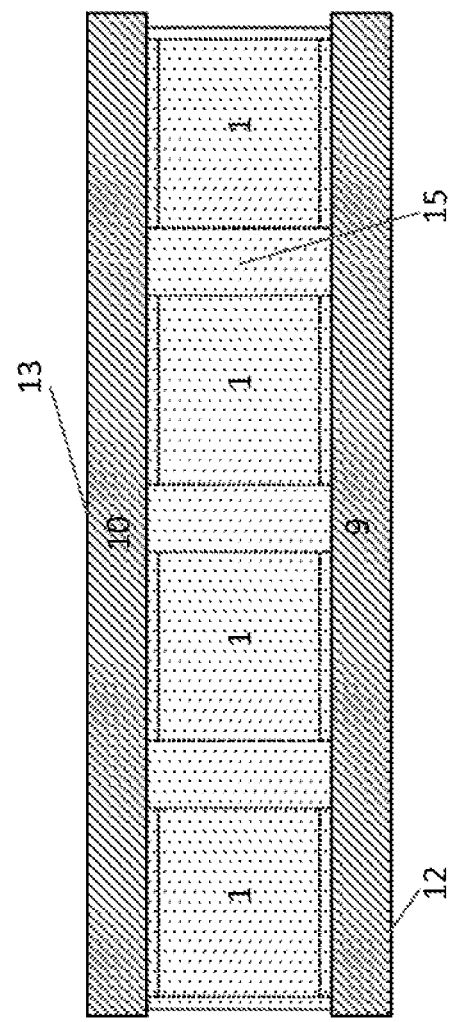
Figure 2:
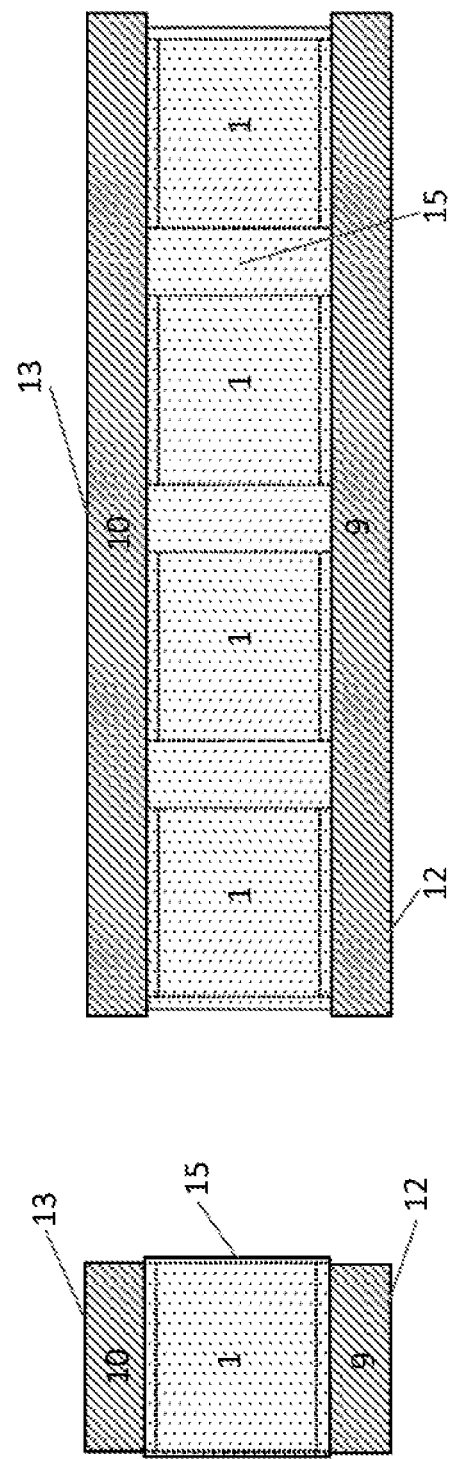
Figure 2:
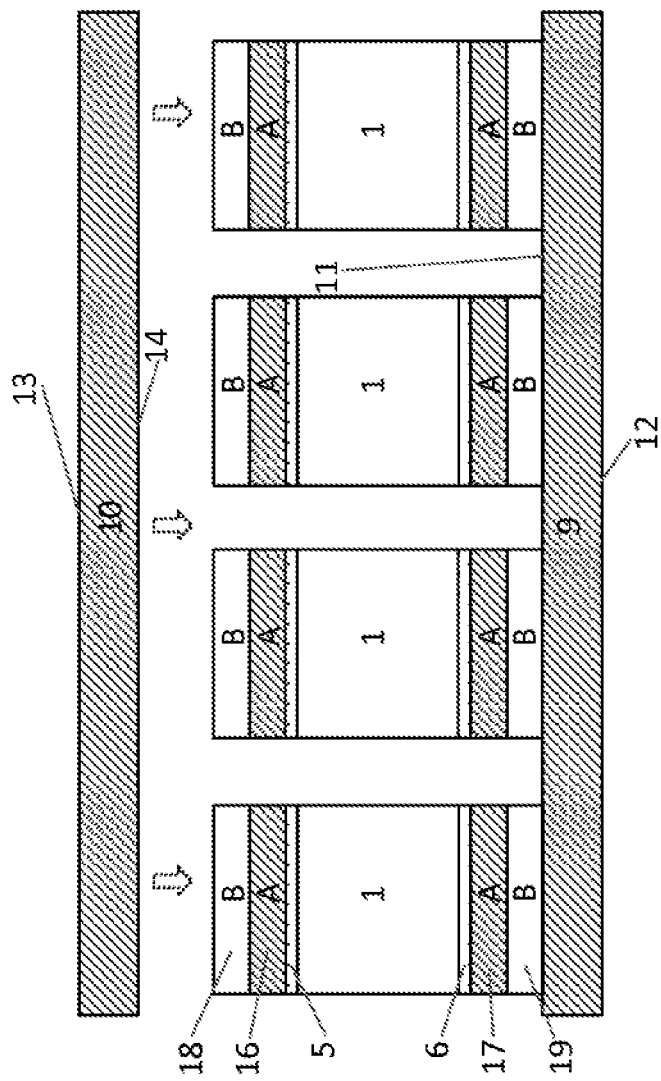
Figure 2:
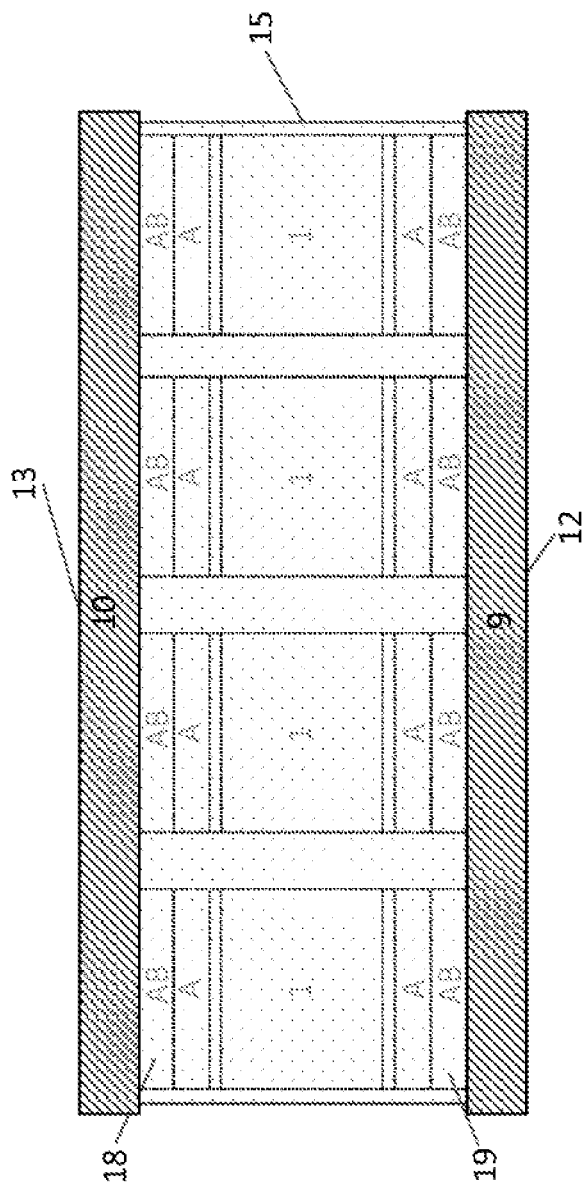

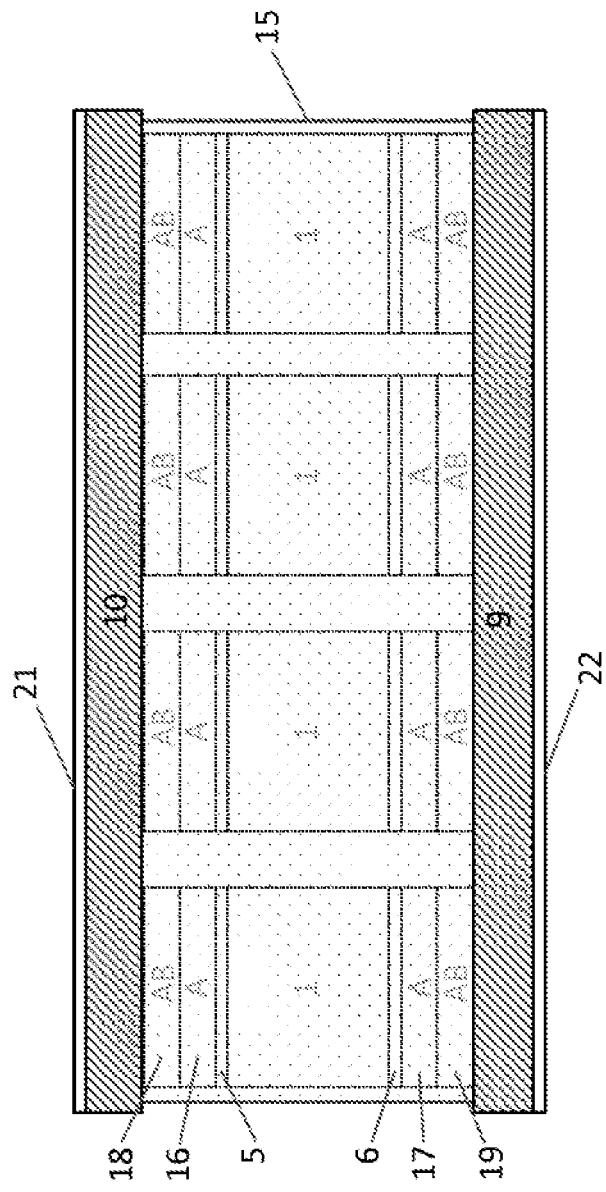
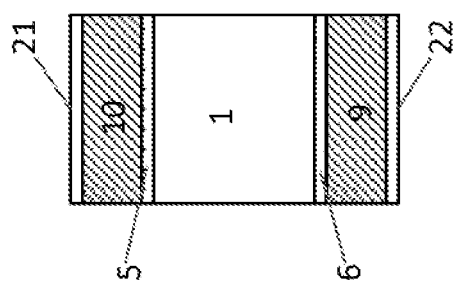
Figure 2 i)
Figure 2 j)

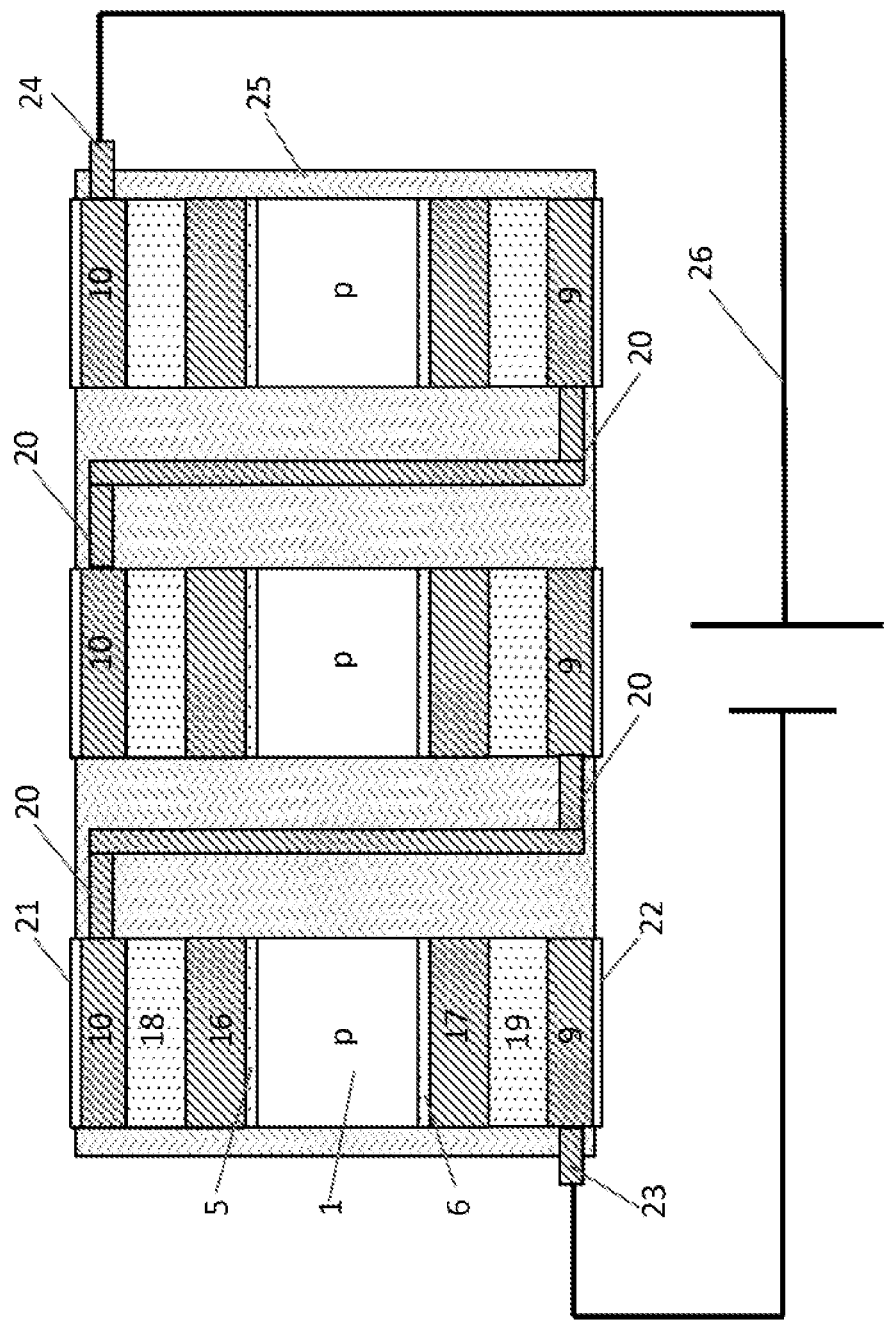

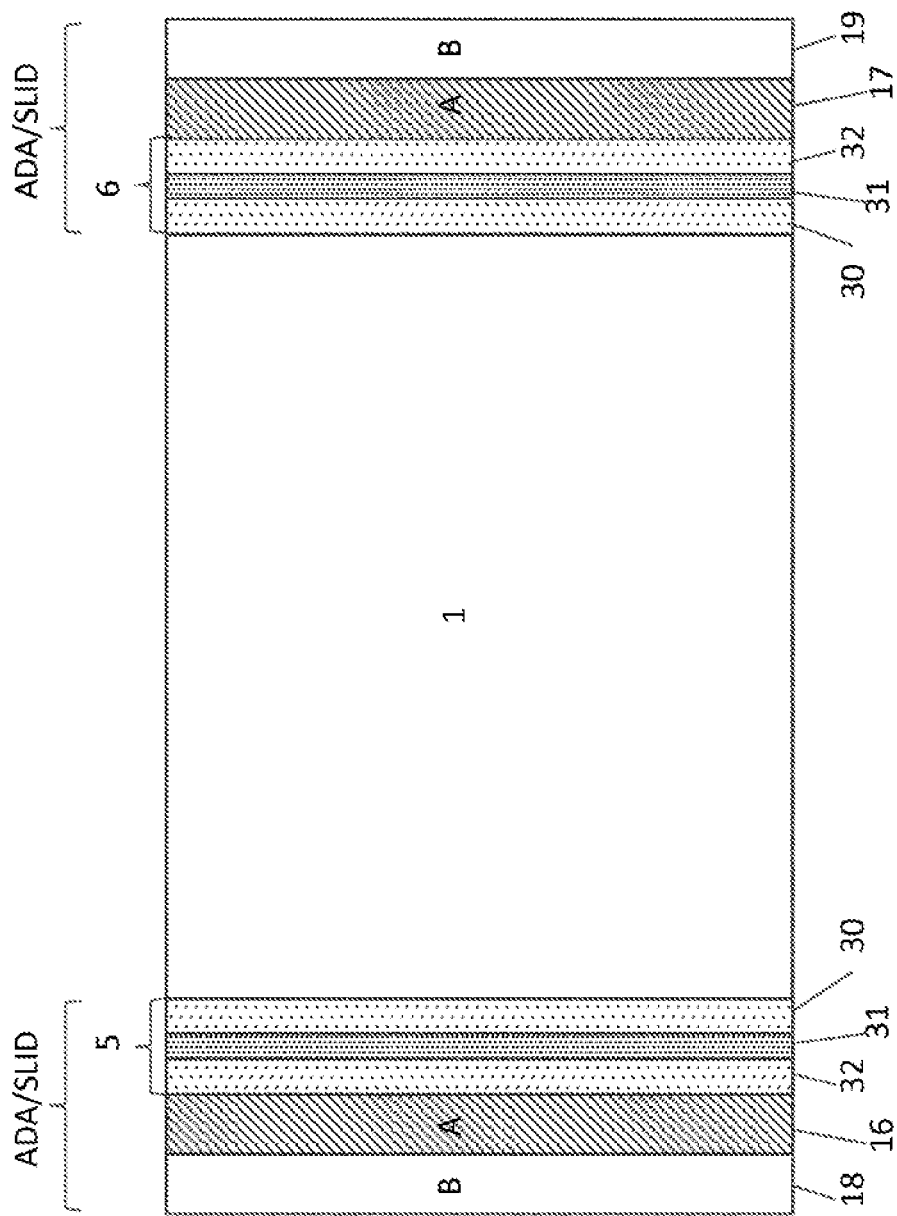
Figure 4)

THERMOELECTRIC HALF-CELL AND METHOD OF PRODUCTION

The present invention relates to a manufacturing method of sealed high-temperature thermoelectric elements, and thermoelectric elements made thereof.

BACKGROUND

A thermoelectric element converts a fraction of heat energy flowing through the element as a function of the size of the heat flux through the element and the Seebeck coefficient of the thermoelectric material of the element.

The Seebeck effect is one of three possible expressions of the thermoelectric effect, namely the direct conversion of thermal energy to electric energy found in some materials when subject to a temperature gradient creating a heat flux through the material. The Seebeck effect will, when connecting the material to a heat sink on one side and a heat source on the opposite side, create an electric potential which may be utilised for driving an electrical device or charging a battery. The thermoelectric conversion efficiency is dependent on the materials Seebeck coefficient and ratio electric over thermal conductivity and is usually defined as the dimensionless figure of merit, ZT:

$$ZT = \frac{\sigma S^2}{\kappa} \cdot T \tag{1}$$

where $\sigma$ is electric conductivity, S is a thermoelectric coefficient often termed the Seebeck-coefficient, $\kappa$ is thermal conductivity, and T is absolute temperature.

Skutterudite is a class of minerals discovered at Skutterud in Norway in 1827, often denoted by the general formula $TPn_3$, where T is a transition metal such as e.g.; Co, Rh, In, Fe, and Pn is one of the pnictogens (member of the nitrogen group in the periodic table); P, As or Sb. The skutterudite is semiconducting when electric neutral, that is, maintains a ratio of $T:[Pn_4]=4:3$. Further, due to its covalent bonding structure, the skutterudite crystal lattice has high carrier mobility. At the same time, the complexity of the crystal lattice combined with the heavy atoms results in a relatively low thermal conductivity, so that semiconducting skutterudites often have a favourable electric over thermal conductivity ratio and thus promising figures of merit, ZT.

Semiconducting materials conduct electricity by using two types of charge carriers; electrons and holes (vacant electron sites in the crystal lattice atoms). By doping, i.e. substituting one or more of the T atoms in the crystal lattice with an atom of another element, the semiconducting material can be made to dominantly conduct electric charges by either electrons (n-type conductivity) or holes (p-type conductivity), depending on which dopant (substitute element) being introduced.

An n-type and a p-type semiconductor may be electrically connected to form an electric circuit as schematically illustrated in FIG. 1a). In the figure, an object 100 of n-type semiconducting material is in one end electrically connected to an object 101 of p-type semiconducting material by electric contact 102. At the opposite ends, the objects 100 and 101 are separately connected to one electric conductor 103. The electric conductors 103 may be connected together by an external electric circuit 106, in which electric current will flow as long as charge carrier couples (separate electrons and holes) are created in the semiconducting materials.

In a thermoelectric semiconducting material, charge carrier couples are made when heat flows through the material. Thus, by making the electrodes 103 in thermal contact with a heat reservoir and the opposite electrode 102 in thermal contact with a heat sink, a heat flux will flow through the semiconducting materials 100 and 101 in the direction indicated by the arrow, and an electric current will flow from the n-type semiconductor to the p-type semiconductor as long as the external electric circuit 106 is closed. The contact with the heat reservoir is typically obtained by an outer substrate 105 while the contact with the heat sink is typically obtained by an outer substrate 104, as shown in FIG. 1a). The electric contacts 103 and 104 are typically attached to the outer substrates 105 and 104, respectively. The configuration shown in FIG. 1a) constitutes the basic principle of how thermoelectric devices may be constructed. In practice, there will usually be employed several n-type and p-type semiconducting materials electrically connected in series and thermally connected in parallel as shown in i.e. FIG. 1b), which is a facsimile of FIG. 18 of U.S. Pat. No. 6,660,926.

A thermoelectric device of this kind may provide a compact, highly reliable, long lasting, and noiseless and pollution free manner of generating electric power from a heat source.

PRIOR ART

U.S. Pat. No. 6,660,926 discloses that the thermal conductivity of skutterudite can be reduced, and thus obtain a higher figure of merit, by filling the two vacant smaller cubes of the 32-atom unit cell with a binary compound and in addition substituting elements to replace part of the original transition metal and/or pnictogen elements to conserve the valence electron count of the unit cell. The document discloses several examples of such materials having high ZT-values, of which one is $CeFe_{4-x}Co_xSb_{12}$.

From WO 2011/014479 it is known that owing to its large crystal cells, heavy atomic mass, large carrier mobility and disturbance of filled atoms in the Sb-dodecahedron, thermoelectric materials of $CoSb_3$ based skutterudite exhibit superior thermoelectric properties at temperatures in the range from 500 to 850 K. The document discloses that the n-type skutterudite $Yb_yCo_4Sb_{12}$ has a ZT of 1.4 and that p-type skutterudite $Ca_xCe_yCo_{2.5}Fe_{1.5}Sb_{12}$ has a ZT of 1.2. The document discloses further that at 850 K, the vapour pressure of Sb is about 10 Pa, leading to a serious degradation of the semiconductor due to loss of the element Sb. The solution to this problem according to WO 2011/014479 is to coat the skutterudite material with a first metal layer and a second metal oxide layer. The metal layer may be one of; Ta, Nb, Ti, Mo, V, Al, Zr, Ni, NiAl, TiAl, NiCr, or an alloy of two or more of them; and the metal oxide may be one of $TiO_2$, $Ta_2O_5$, $Al_2O_3$, $ZrO_2$, $NiO_2$, $SiO_2$, or a composite of two or more of them, or a multi-layer of two or more of them.

According to U.S. Pat. No. 6,673,996, skutterudite is the only known single thermoelectric material suitable for use over the temperature range from room temperature up to about 700° C. The document describes $CeFe_4Sb_{12}$ based alloys and $CoSb_3$ based alloys as suited materials for p-type and n-type thermoelectric materials, respectively. On the cold side, the thermoelectric materials are connected to a cold shoe made of $Al_2O_3$ coated with a layer of Cu to provide the electric and thermal contact. In order to protect the thermoelectric material from in-diffusion of Cu, there is employed a diffusion barrier of Ni which is formed onto the Cu-layer by electroplating.

Another example of employing $CoSb_3$ based skutterudite as thermoelectric material in a thermoelectric device is shown in U.S. Pat. No. 6,759,586. In this document there is disclosed a thermoelectric device comprising a piece of $CoSb_3$ based skutterudite as either n-type or p-type conductivity attached to an electrode made of a Fe-alloy or an Ag-alloy, and which employs a diffusion barrier between the skutterudite and the electrode made of Sb and one of Au, Ag or Cu.

From WO 2012/071173 it is known a thermoelectric device using skutterudite as the thermoelectric conversion material which is covered with a thin barrier layer deposited by atomic layer deposition. Examples of suited barrier layers include metal oxides such as; $Al_2O_3$, $TiO_2$, $Ta_2O_5$, $SnO_2$, ZnO, $ZrO_2$, and $HfO_2$), and metal nitrides such as; $SiN_x$, TiN, TaN, WN, and NbN).

EP 2 242 121 describes a certain class of filled skutterudite suited for being used as thermoelectric conversion material at temperatures in the range from 20 to 600° C. The group is defined by the general formula: $R_rT_{t-m}M_mX_{x-n}N_n$ ($0<r\leq 1$, $3\leq t-m\leq 5$, $0\leq m\leq 0.5$, $10\leq x\leq 15$, $0\leq n\leq 2$), where R represents three or more elements selected from the group consisting of rare earth elements, alkali metal elements, alkaline-earth metal elements, group 4 elements, and group 13 elements, T represents at least one element selected from Fe and Co, M represents at least one element selected from the group consisting of Ru, Os, Rh, Ir, Ni, Pd, Pt, Cu, Ag, and Au, X represents at least one element selected from the group consisting of P, As, Sb, and Bi, and N represents at least one element selected from Se and Te. The document discloses further that in order to obtain a good junction between the thermoelectric conversion material end the electrodes of the thermoelectric device, it should be employed a joining layer between these phases comprising an alloy with a composition adjusted to match the thermal expansion coefficient of the thermoelectric conversion material. Examples of suited alloys for use as the joining layer includes titanium alloy of 50 to 100 weight % Ti, and from 0 to 50 weight % of at least one of Al, Ga, In, and Sn. In another example, the joining layer is made of a nickel alloy of 50 to 100 weight % Ni, and from 0 to 50 weight % of Ti. The electrode may be an alloy selected from the group of; titanium alloys, nickel alloys, cobalt alloys, and iron alloys.

Bader et al. 1994 [1] has studied bonding two metals together by use of solid-liquid interdiffusion (SLID) bonding, where a low melting point metal and a high melting point metal are bonded together by forming an intermetallic compound of the two metals at their joint. In one example, the document discloses bonding two pieces of nickel, each having a tin layer on one side, by gently pressing the sides with tin layers against each other and heating the pieces until the tin melts and maintaining the gentle pressure and the temperature until all liquid tin has reacted with the nickel and formed a solid Ni—Sn intermetallic compound which securely bonds the metal pieces together, as illustrated schematically in FIGS. 3a) to c). From the Ni—Sn phase diagram presented in the document we have that the melting point of Sn is 232° C., while all of the possible intermetallic compounds, $Ni_3Sn$, $Ni_3Sn_2$, and $Ni_3Sn_4$, have a melting point above 800° C.

US 2013/0152990 discloses use of the SLID-technology for bonding electrodes to thermoelectric conversion materials. The document mentions $Bi_2Te_3$, GeTe, PbTe, $CoSb_3$, and $Zn_4Sb_3$ as examples of thermoelectric conversion materials, and the thermoelectric conversion material is first coated with a 1 to 5 μm thick barrier layer of Ni or other suited material, then with a 2-10 μm thick Ag, Ni or Cu layer, and finally with 1-10 μm thick Sn layer. The electrode is on one side first coated with a 2-10 μm thick Ag, Ni or Cu layer, and then with 1-10 μm thick Sn layer. The coated thermoelectric conversion material and the electrode are then laid with their Sn layers side by side and pressed together under a gentle heating until the Sn layers melt and react with the Ag, Ni or Cu to form solid intermetallic compounds bonding the electrode to the thermoelectric conversion material.

US 2009/0102003 discloses method for producing a package including an electrical circuit in a more efficient manner, where the electrical circuits located on a substrate are first tested for their functionality and then the functional circuits are connected by means of a frame enclosing the circuit on the surface of the substrate to a second substrate whose surface area is smaller than that of the first substrate. The substrates are connected, by means of a second frame, which is adapted to the first frame and is located on the surface of the second substrate, such that the first and second frames lies one on top of the other. The bonding may be obtained by SLID-bonding.

US 2011/0024923 discloses systems and methods for forming an encapsulated device which include a hermetic seal which seals an insulating environment between two substrates, one of which supports the device. The hermetic seal is formed by an alloy of two metal layers, one deposited on a first substrate and the other deposited on the second substrate. At least one of the substrates may include a raised feature formed under at least one of the metal layers. One of the metal layers may have a diffusion barrier layer and a "keeper" layer formed thereover, wherein the keeper layers keeps the metal confined to a particular area. By using such a "keeper" layer, the substrate components may be heated to clean their surfaces, without activating or spending the bonding mechanism.

EP 0 609 062 discloses a method for the sealing and electrical testing of electronic devices; and particularly for surface acoustic wave devices. In accordance with the present invention, the cost and size of making hermetically sealed packages for electronic devices and of electrically testing each device is significantly reduced over the prior art by making use of mass simultaneous sealing and electrical connection at the wafer level, and by using substrates with hermetically sealed and electrically conductive via holes. Further, cost reduction is effected by making use of final electrical testing with wafer probe test techniques before dicing.

US 2012/0319303 relates to systems and methods for forming an encapsulated device include a hermetic seal which seals an insulating environment between two substrates, one of which supports the device. The hermetic seal is formed by an alloy of two metal layers, one deposited on a first substrate and the other deposited on the second substrate. At least one of the substrates may include a raised feature formed under at least one of the metal layers. The two metals may for an alloy of a predefined stoichiometry in at least two locations on either side of the midpoint of the raised feature. This alloy may have advantageous features in terms of density, mechanical, electrical or physical properties that may improve the hermeticity of the seal, for example.

US 2007/0048898 is another prior art solution for forming an encapsulated device include a hermetic seal which seals an insulating environment between two substrates, one of which supports the device. The hermetic seal is formed by an alloy of two metal layers, one deposited on a first substrate and the other deposited on the second substrate, along with a raised feature formed on the first or the second substrate. At least one of the metal layers may be deposited conformably over the raised feature. The raised feature penetrates the molten material of the first or the second metal layers during formation of the alloy, and produces a spectrum of stoichiometry's for the formation of the desired alloy, as a function of the distance from the raised feature. At some distance from the raised feature, the proper ratio of the first metal to the second metal exists to form an alloy of the preferred stoichiometry.

US 2007/0048887 discloses another examples of systems and methods for forming an encapsulated MEMS device include a hermetic seal which seals an insulating gas between two substrates, one of which supports the MEMS device. The hermetic seal may be formed by heating at least two metal layers, in order to melt at least one of the metal layers. The first melted metal material flows into and forms an alloy with a second metal material, forming a hermetic seal which encapsulates the MEMS device.

U.S. Pat. No. 5,429,680 discloses a thermoelectric heat pump including combination adherent and metal migration barrier layers intermediate the ends of the n-type and p-type semiconductors and the metallic electrical conductors, the layers enhance the adherence to the ends of the semiconductors and prevent migration or diffusion of metal into the semiconductors.

OBJECTIVE OF THE INVENTION

The main objective of the present invention is to provide a simple and cost-effective manufacturing method of a thermoelectric half-cell having high thermal conversion efficiency and a thermoelectric half-cell made by the method.

A further objective is to provide thermoelectric half-cells made by the method, and in particular thermoelectric half-cells utilising filled and non-filled $CoSb_3$-based skutterudite thermoelectric conversion materials.

DESCRIPTION OF THE INVENTION

The invention is based on the realisation that the thermal resistance across a thermoelectric cell should be as low as possible in order to enhance the electricity production in the cell, and further that the thermoelectric material should be adhered to the metallic contacts by solid bonds having excellent thermal and electric contact. The realisation leads to a manufacturing concept based on forming thermoelectric half-cells doped to either p-type conductivity or n-type conductivity, which subsequently are interconnected to a fully working thermoelectric device.

Thus, in a first aspect the present invention relates to a method for manufacturing a thermoelectric half-cell, wherein the method comprises:
  a) providing more than one element of a semiconducting thermoelectric conversion material, where each of the provided elements is either of p-type conductivity or n-type conductivity and comprises a side surface, a first end surface, and a second end surface, and where the first and second end surfaces are opposite each other and substantially planar and parallel, and substantially perpendicular to the side surface,
  b) providing a first and a second contact substrate, where the first and the second contact substrate are made of a metal A and have a substantially planar upper and lower end surface which are opposite each other and substantially mutually parallel,
  c) depositing a first adhesion layer covering the first end surface of each of the provided elements of a semiconducting thermoelectric conversion material, and a second adhesion layer covering the second end surface of each of the provided elements of a semiconducting thermoelectric conversion material,
  d) arranging the provided elements of a semiconducting thermoelectric conversion material onto the first contact substrate at a distance from each other, and enabling thermal and electric contact between the upper end surface of the first contact substrate and the first adhesion layer of each of the provided elements of a semiconducting thermoelectric conversion material,
  e) arranging the second contact substrate onto each of the provided elements of a semiconducting thermoelectric conversion material being arranged onto the first contact substrate and enabling thermal and electric contact between the lower end surface of the second contact substrate and the second adhesion layer of each of the provided elements of a semiconducting thermoelectric conversion material being arranged onto the first contact substrate, and
  f) depositing a first dielectric layer onto the upper surface of the second electric and thermal contact substrate and a second dielectric layer onto the lower surface of the first electric and thermal contact substrate.

In a second aspect, the invention relates to a thermoelectric half-cell, comprising:
more than one element of a semiconducting thermoelectric conversion material (1), where each of the at least one element (1) is doped to either p-type conductivity or n-type conductivity, and has a side surface (2) and a first (3) and a second (4) end surface at two opposite sides which are substantially mutually parallel to each other, planar, and perpendicular to the side surface (2), and where;
  a first adhesion layer (5) is deposited onto the first end surface (3) of each of the more than one element of a semiconducting thermoelectric conversion material (1), and
  a second adhesion layer (6) is deposited onto the second end surface (4) of each of the more than one element of a semiconducting thermoelectric conversion material (1),
a first (9) and a second (10) contact substrate made of a metal A, where each of the first and second contact substrates have a substantially planer upper surface (11, 13) and a substantially planar lower surface (12, 14) being mutually opposite and substantially parallel,
a first dielectric layer (15) deposited and covering the entire upper surface (13) of the second contact substrate (10), and
a second dielectric layer (16) deposited and covering the entire lower surface (12) of the first contact substrate (9), and wherein:
each of the more than one element of a semiconducting thermoelectric material (1) is arranged at a distance from each other in between the first (9) and the second (10) contact substrate such that:
  one of the first (5) or second (6) adhesion layer is facing and in electric and thermal contact with the lower surface (14) of the second contact substrate (10), and the other of the first (5) or second (6) adhesion layer not in contact with the second contact substrate (10), is facing and in electric and thermal contact with the upper surface (11) of the first contact substrate (9).

One advantage of thermoelectric half-cell according to the first and second aspect of the invention is that is has a particularly simple structural composition involving a relatively small number of material layers across the half-cell from its first to its second end. This has the advantage of requiring relatively little workload and resource consumption in manufacturing. Another advantage is that the simple construction involves few cross-sectional interfaces between material layers which together with the low number of material layers results in a relatively low thermal resistance across the half-cell. Another factor contributing to the low thermal resistance is the use of a metallic contact layer functioning both as the electric and thermal contact layer, as opposed to prior art solution where the electric contact and the thermal contact typically are obtained by use of a metallic layer as the electric contact and a ceramic or other non-metallic layer as the thermal contact.

The invention according to the first and second aspect is illustrated schematically in FIGS. 2 a) to 2i). Each figure is a cross-sectional cut view seen from the side.

As used herein, the terms "horizontal" and "vertical" are related to the end surfaces of the elements of the semiconducting thermoelectric conversion material, such that i.e. a horizontally oriented plane is a plane which is substantially parallel with these end surfaces. Consequently, the term "vertical" as used herein, is related to the side surface of the elements of the semiconducting thermoelectric conversion material, such that i.e. a vertically oriented plane is a plane which is substantially parallel with the side surface of these elements. The horizontal direction as defined herein is indicated in FIG. 2a) by the stapled line marked with "A" and "A'", while the vertical direction is indicated by the stapled line marked with "B" and "B'". Furthermore, the terms "upper" and "lower" as used herein refer to their relative position in the vertical direction such that an upper position is above a lower position.

In FIG. 2a), an example embodiment of an element of semiconducting thermoelectric conversion material doped to either p-type conductivity or n-type conductivity is shown and marked by reference number 1. The first end surface is marked with reference number 3 while the second end surface is marked with reference number 4. The side surface is marked with reference number 2. FIG. 2a) illustrates the element 1 as a rectangular parallelepiped with smooth and planar surfaces. However, this is not a mandatory feature of the present invention. On the contrary, the term "element of semiconducting thermoelectric conversion material" as used herein, means any lump, piece or other form of a compact mass of a solid semiconducting conversion material exhibiting satisfactory ZT-values for being used in thermoelectric modules when doped to either p-type or n-type conductivity, where the element has a first and second substantially planar and parallel end surface at two opposite sides of the element and as long as the side surface of the element between the two end surfaces is substantially perpendicular to the end surfaces. The latter feature of having substantially planar and parallel end surfaces substantially perpendicular to the side surface is a made from a practicality perspective intended to allow juxtaposing the elements in a relatively tight pattern with short distances apart from each other in between a first and second contact substrate. The invention may thus function equally well by using elements of semiconducting thermoelectric conversion material having moderately inclined surfaces and surfaces having a certain degree of irregularity/non-planarity as long as it is practically feasible to compensate for these "defects" by the other components of the thermoelectric half-cell. A person skilled in the art is able to determine where the limits for geometric deviation from the ideal shape of the perpendicular parallelepiped are in the practical life. The terms "substantially planar and parallel" and "substantially perpendicular" as used herein are thus to be interpreted in this context. An example of a suited material is filled or non-filled $CoSb_3$-based skutterudite thermoelectric conversion materials due to their promising figure of merit, ZT, at temperatures up to about 800° C. Another example of a suited material is filled or non-filled silicide based thermoelectric materials, e.g. $Mg_2Si$, or $MnSi_{1.7}$, due to their high abundance, non-toxic content, and a promising ZT at temperatures up to about 550° C. $Bi_2Te_3$ (bismuth telluride) and its solid solutions is an example of another suited material due to their high ZT at RT and up to 200° C.

FIG. 2b), illustrates the same embodiment of the element 1 as shown in FIG. 2a), but now including a first adhesion layer 5 deposited onto and covering the first end surface 3, and a second adhesion layer 6 deposited onto and covering the second end surface 4. At this stage, the first adhesion layer 5 has a "free" surface 7 facing away from the element 1, and the second adhesion layer 6 has a "free" surface 8 facing away from the element 1.

The first and second adhesion layer of the half-cell according to the first and second aspect of the invention may advantageously be a metal layer since many metals are known to adhere well to semiconducting materials. Examples of suited metals for use as adhesion layers includes, but is not confined to; Cr, Cu, Sn, Ta, and Ti. The thickness of the first and second adhesion layer may advantageously be in one of the following ranges; from 30 nm to 100 µm, from 50 nm to 50 µm, from 100 nm to 15 µm, from 200 nm to 10 µm, from 500 nm to 5 µm, or from 500 nm to 1 µm. The term "metal" as used in the first and second aspect of the invention is to be interpreted as metal in the generic sense of the term such that it encompasses elementary metal as well as alloys of the same metal including inevitable impurities. Thus, for example, if the metal in one example embodiment is Ni, the term may be interpreted to be elementary Ni or a Ni-alloy such as i.e. nickel vanadium alloy, nickel silver alloy or other nickel alloys.

Semiconducting thermoelectric conversion materials may leach elements by solid interdiffusion etc. which are detrimental to the thermal and electric properties of the contact substrates. This problem may be alleviated or resolved by employing an intermediate diffusion barrier layer between the semiconducting thermoelectric conversion material and the electric contact substrates to protect the electrodes. Thus, in one example embodiment, the first and second adhesion layers may advantageously include an intermediate diffusion barrier layer such that the adhesion layer becomes a stratified structure of at least one adhesion film followed by a—diffusion barrier layer and then another adhesion film (herein, interchangeably also termed as; the ADA-structure). The ADA-structure may provide a strong and resilient mechanical bonding between the contact substrate and the semiconducting thermoelectric conversion material, and is especially suited for use in high-temperature thermoelectric modules which for some embodiments may be heated up to 700-800° C. which are subject both to relatively high thermal stresses and solid interdiffusion problems.

The diffusion barrier layer may advantageously be a thin layer of a thickness from 100 nm and above of a metal oxide or a metal nitride. Examples of preferred diffusion barrier layers include, but are not limited to 100-1000 nm thick layers of $CrN_x$, $TaN_x$, or $TiN_x$ formed by vapour deposition. The thickness of the diffusion barrier layer may advantageously be in one of the following ranges: from, 50 to 5000 nm, from 75 to 3000 nm, from 100 to 2000 nm, from 150 to 1000 nm, from 150 to 750 nm, from 200 to 500 nm, from 200 to 400 nm or from 200 to 300 nm.

The adhesion films of the ADA-structure may advantageously be a metal layer, either the same metal in each adhesion film of the ADA-structure, or different metals of different adhesion films in the ADA-structure. In the case of applying an ADA-structure including a structure of a first adhesion film, a diffusion barrier layer and then a second adhesion film, the thickness of the first adhesion film may advantageously be in one of the following ranges; from 20 nm to 2 µm, from 50 nm to 1.5 µm, from 100 nm to 1.5 µm, from 200 nm to 1.5 µm, or from 500 nm to 1.5 µm, while the thickness of the second adhesion film may be in one of the following ranges; from 20 nm to 100 µm, from 50 nm to 50 µm, from 100 nm to 15 µm, from 200 nm to 10 µm, from 500 nm to 5 µm, or from 500 nm to 1 µm. The actual choice of which metal to be applied as the second adherence layer is usually dependent upon which materials are being applied diffusion barrier layer and in the first bonding layer. A person skilled in the art is able to make this selection from her/his general knowledge or by standard trial and error experiments.

The deposition of the first and/or the second adhesion layer may advantageously be obtained by one of atomic, chemical or physical vapour deposition. In the example embodiment of forming an ADA-structured adhesion layer, a substantial work load saving and simplification of the manufacturing process may be obtained by employing the same metal in both the first and second adhesion films of the ADA-structure as the metal of the metal oxide or metal nitride of the diffusion barrier layer. In this case the ADA-structure becomes made up of one single metal in elementary form and the same metal as an oxide or nitride, such that the entire ADA-structure may be deposited in one single vapour deposition process by simply changing the composition of the pre-cursor gases being fed into the deposition chamber. Thus, if the diffusion barrier layer is made of one of the preferred layers of CrN, TaN or TiN, both the first and second adhesion films may advantageously be made of elementary Cr, Ta, or Ti, respectively. Thus, the invention according to the first aspect may additionally comprise the following steps for depositing the first and/or the second adhesion layer:

placing the provided elements of a semiconducting thermoelectric conversion material into a deposition chamber, and then:
i) depositing a first metal layer of a first metal directly onto the first and the second end surface of the provided elements,
ii) depositing a diffusion barrier layer of a non-metallic compound of a second metal directly onto the metal layer on the first and second end surface of the provided elements, and
iii) depositing a second metal layer of a third metal directly onto the diffusion barrier layer of the non-metallic compound of the second metal on the first and second end surface of the provided elements,
wherein
the deposition chamber is either a chemical vapour deposition chamber, a physical vapour deposition chamber, or an atomic deposition chamber, and the deposition of the different layers of steps i) to iii) is obtained by feeding pre-cursor gases with varying chemical composition into the deposition chamber, and
the non-metallic compound of the second metal is either a nitride or an oxide of the second metal.

The term "non-metallic compound of a metal" as used herein means a chemical compound of that metal, such as i.e. a metal nitride, metal oxide, or other chemical compound of that specific metal which does not exhibit chemical or physical properties of a typical metal. Intermetallic compounds involving this specific metal are thus not included in this term.

FIG. 2c), illustrates an example embodiment not part of the invention where the same embodiment of the element 1 as shown in FIGS. 2a) and 2b), but now at the stage where the element is placed onto and made in thermal and electric contact with the first contact substrate 9 and the second contact substrate 10 is about to be arranged on top of and made in thermal and electric contact with the element 1. As seen on the figure, the second end surface 4 of the element 1 is facing the upper surface of the first contact substrate 9, while the lower surface 14 of the second contact substrate 10 is facing the first end surface 3 of the element 1. The arrangement shown in FIG. 2c) with the first adhesion layer being above the second adhesion layer is arbitrarily since the element 1 has a horizontally oriented symmetry plane. Thus, the element 1 may as well be made in thermal and electric contact with the first 9 and second 10 contact substrate 10 in an up-side-down position, i.e. with the first adhesion layer 5 in contact with the first contact substrate 9 and the second adhesion layer 6 in contact with the second contact substrate 10.

The thermoelectric half-cell according to the first and second aspect of the invention is made up of an ensemble of a number of elements 1 of either p-type or n-type conductivity. Each of the elements 1 is made in thermal and electric contact with a single first 9 and a single second 10 contact substrate in the same manner as the single element 1 shown in FIG. 2c) is attached to its respective contact substrates. Thus, the term "each of the provided elements is either of p-type or n-type conductivity" as used herein, means that every single of the elements 1 being applied to form the thermoelectric half-cell has the same polarity, which may either be p-type or n-type, such that the invention according to first aspect results in a thermoelectric half-cell having either p-type of n-type conductivity. It may, especially for thermoelectric devices intended for use in high-temperature applications and/or thermal cycling, be advantageous to employ an ensemble of a relatively high number of "small" thermoelectric half-cells instead of one or only a few relatively "larger" thermoelectric half-cells which are made in thermal and electric contact with the same first and second contact substrate as shown in e.g. FIG. 2d). The terms "small" and "large" refer to the horizontal cross-sectional area of the elements 1. Each of the elements 1 being applied in the latter example embodiment (as shown in FIG. 2d)) may advantageously have a rectangular horizontal cross-section of area in the range from 0.5 to 4 $mm^2$. The elements may be obtained by e.g. dicing wafers of the semiconducting thermoelectric conversion material into these appropriate sized elements. The advantage of applying ensembles of relatively many small elements 1 (with adhesion layers) is that the interface area between each element and the contact substrates becomes smaller, resulting in lesser thermomechanical strains in/across the interface and thus increased reliance/durability of the thermoelectric half-cells according to the first and second aspect of the invention. The invention according the first and second aspect involving more than one element of semiconducting thermoelectric conversion material is illustrated schematically in FIG. 2d). The figure illustrates the latter example embodiment at the same stage as the example embodiment shown in FIG. 2c), i.e. the second contact substrate 10 is being arranged onto the opposite "free" end of the elements 1 which are arranged in a juxtaposed pattern with a distance from each other onto the first contact substrate 9.

As may be seen from FIG. 2d), the surface area of the inner planes 11, 14 of the first 9 and second 10 contact substrates, respectively, may advantageously be made sufficiently large to provide an "extension" outside the periphery of the juxtaposed group of elements 1. This feature of having a forming space for a sealing enclosure provides the advantage of forming space for a sealing enclosure running along the periphery of the juxtaposed group of elements 1 which seals off the interior space between the first 9 and second 10 contact substrate from the ambient environment. The interior space may advantageously be filled with a gas which is chemically inert towards the materials in the thermoelectric half-cells according to the first and second aspect of the invention. Furthermore, in another alternative, the sealing enclosure 15 may encapsulate the side surface 2 of the element 1 in cases where the first 9 and second 10 contacts substrates have the same horizontal cross-sectional dimensions as the element 1, and thus be forming an expansion along the middle part of the element 1, as shown schematically in FIG. 2 f).

The use of a sealing enclosure may be especially advantageous in cases where the semiconducting thermoelectric conversion material is vulnerable towards ambient oxygen or other chemical component in the operating environment of the thermoelectric half-cell, and/or in cases where the thermoelectric conversion material is relatively volatile and thus subject to sublimation at the operation temperature. In such cases, a sealing will enhance the durability and reliance of the thermoelectric half-cells according to the first and second aspect of the invention. The sealing enclosure may be made of any known or conceivable enclosure having the sufficient mechanical integrity to form a gas tight enclosure and withstand the thermal stresses and temperatures at which the thermoelectric half-cells are exposed to under the intended use. Examples of suited sealing enclosures includes, but are not limited to, glass frit wall, a metallic wall etc. which is attached by welding, inductive soldering, and other techniques. In the example embodiment of forming a sealing enclosure running along the peripheral area of the first and second contact substrates to encapsulate an ensemble on elements 1, such as shown in e.g. FIG. 2f), an example embodiment of an especially suited sealing is the sealing frame described in Norwegian patent application no. NO 20150216. The latter document is incorporated its entirety by reference, see especially the description from line 27 on page 12 to line 7 on page 13. In the present invention according to the first and second aspect, the sealing frame is made to stretch from the surface of the first (9) to the second (10) contact substrate, instead of from the surface of the cover substrates as in the invention of NO 20150216. This example embodiment of a sealed thermoelectric half-cell according to the first and second aspect of the invention is illustrated schematically in FIG. 2f). FIG. 2f) illustrates the same example embodiment shown in FIG. 2d) after the second contact substrate is made in thermal and electric contact with the elements of semiconducting thermoelectric conversion material and the sealing enclosure 15 of e.g. glass frit is formed. The elements of semiconducting thermoelectric conversion material including their adhesion layers are positioned inside the sealing enclosure 15 and are thus indicated in the figure by stapled lines.

The first and the second contact substrate according to the first and second aspect of the invention may be made of any metal known by the person skilled in the art being suited for forming electric contacts in semiconductor appliances. Examples of suited metals, i.e. the metal A, of the first and the second electric and thermal contact substrate include, but are not limited to; Ag, Al, Au, Cu, In, Ni, Pt, and Sn. Examples of thicknesses of the metal layer of metal A being applied as the first and the second electric and thermal contact substrate includes, but are not limited to one of the following ranges; from 2 μm to 1 cm, from 1 μm to 0.5 cm, from 2 μm to 0.1 cm, from 2 μm to 500 μm, from 3 μm to 100 μm from 3 μm to 50 μm, or from 3 μm to 10 μm.

The term "enabling thermal and electric contact between" as used herein, means that the actual surfaces are made to contact each other such that heat and/or electric energy may flow across the interface between the surfaces. In practice, this may involve arranging the surfaces to contact each other and attaching them together, such as in the example embodiment illustrated in FIGS. 2a) to f). In this example embodiment, the first and second contact substrate is laid and attached directly onto the first and second adhesion layer, respectively. The first and second contact substrate may be attached to the its respective adhesion layer of the element of semiconducting thermoelectric conversion material by any known and conceivable method known to the person skilled in the art for bonding two metallic objects together in a mechanically resilient manner and which provides an excellent electric and thermal contact. Examples of suited methods for attaching (bonding) the contact substrate to the adhesion layer according to the first aspect of the invention includes, but are not limited to, laser welding, soldering, solder paste such as e.g. Cu-paste followed by an annealing at a temperature in the range from 300-700° C. to cure the paste, inductive soldering, sintering, etc. The contact substrates are laid directly onto a single adhesion layer in the example embodiments shown in FIGS. 2c) and 2d). This should however not be interpreted as a limitation of the invention according to the first and second aspect. As given above, the adhesion layer may be a stratified ADA-structure.

Furthermore, the enablement of the thermal and electric contact between the adhesion layer and the contact substrate may alternatively involve having one or more intermediate layers of another material between the adhesion layer and contact substrate, such as e.g. additional metallic layers in-between the element 1 and the contact substrate 9, 10 to improve the mechanical resilience of the bonding etc. One example in this regard is to apply solid-liquid interdiffusion bonding, also known as SLID-bonding, for attaching the contact substrate to the element(s) of semiconducting thermoelectric conversion material. The SLID-bond provides an especially strong mechanical bonding combined with excellent thermal and electric contact across the bond, and is thus suited for high-temperature thermoelectric modules which may be heated up to 700-800° C. The term "solid-liquid interdiffusion bonding" or "SLID-Bonding" as used herein, is a high temperature technique for interconnecting two metal phases by use of an intermediate metal phase and annealing such as described in i.e. Bader et al. 1994 [1]. SLID-bonding is also denoted as transient liquid phase bonding, isothermal solidification or off-eutectic bonding in the literature. The interconnection (bonding) in SLID-bonding is obtained by employing an intermediate metal phase which in the liquid phase is chemically reactive against the two outer metal phases forming solid intermetallic compounds, and which has a lower melting point than the two metal outer phases that are to be interconnected. Examples of suited metal systems for SLID-bonding comprise, but are not limited to; Au—In, Au—Sn, Ag—In, Ag—Sn, Cu—Sn, and Ni—Sn.

In the case of applying SLID-bonding for bonding the contact substrate to the semiconducting thermoelectric conversion material in the invention according to the first and second aspect, the method according to first aspect of the invention may advantageously also comprise forming a first bonding layer of the metal A onto and covering the first and second adhesion layer followed by a second bonding layer of a metal B, where the melting point of metal A is higher than metal B and where the metals A and B are chemically reactive towards each other and forms one or more intermetallic compounds by solid-liquid interdiffusion when subject to heating above the melting point of metal B. Examples of suited metal systems for use as metal A and B for SLID-bonding the contact substrate to the element of semiconducting thermoelectric conversion material in the invention according to the first and second aspect comprise, but are not limited to; Au—In, Au—Sn, Ag—In, Ag—Sn, Cu—Sn, and Ni—Sn. In principle, any thickness of the layers of the metal system may be applied in a SLID-bonding. The initial thickness of the first bonding layer of metal A may advantageously be in one of the following ranges; from 1 µm to 1 cm, from 1 µm to 0.5 cm, from 1 µm to 0.1 cm, from 2 µm to 500 µm, from 2 µm to 100 µm, from 2 µm to 50 µm, or from 3 µm to 10 µmm, and the initial thickness of the second bonding layer of metal B may advantageously be in one of the following ranges; from 300 nm to 0.75 cm, 300 nm to 0.3 cm, 300 nm to 750 µm, from 200 nm to 400 µm, from 200 nm to 75 µm, from 200 nm to 30 µm, or from 300 nm to 3 µm. The term "initial thickness" of the first and second bonding layer is the thickness of the respective bonding layer before annealing and formation of the intermetallic compound(s). Both the chemical structure and physical dimensions of the resulting SLID-bond layers are somewhat changed as compared to the initial (non-reacted) bonding layers involved in the SLID-bonding. Examples of suited methods for attaching the first bonding layer of a metal A onto the adhesion layer according to the first and second aspect of the invention includes, but are not limited to, laser welding, soldering, solder paste such as e.g. Cu-paste followed by an annealing at a temperature in the range from 300-700° C. to cure the paste, inductive soldering, sintering, etc. In example embodiments where a second bonding layer of metal B is applied, the attaching of the second bonding layer of a metal B onto the first bonding layer of metal A may be obtained in the same manner as mentioned above for the deposition of the first bonding layer of metal A. Alternatively, the first and second bonding layers may be grown successively onto the adhesion layer by vapour deposition.

In one example embodiment of the invention according to the first and second aspect comprising both the ADA-structured adhesion layers and SLID-bonding, a substantial simplifying and work load saving in the production process is obtained by choosing to apply the same metal in both the first and second adhesion film of the ADA-structure, the metal of the metal oxide or metal nitride of the diffusion barrier layer of the ADA-structure, enabling depositing the layers of the ADA-structure in one deposition process by simply adjusting the precursor gases in the deposition chamber, and then depositing the first and second bonding layer by changing precursor gases. Thus, the entire ADA-structure and bonding layers of may be made in one single deposition process in one single deposition chamber.

An example embodiment of the invention according to the first and second aspect comprising SLID-bonding illustrated schematically in FIGS. 2g) and 2h). FIG. 2g) illustrates a similar thermoelectric half-cell as in FIG. 2d), expect that a first bonding layer 16 of metal A is deposited onto the adhesion layer 5 (which alternatively may be an ADA-structured adhesion layer) followed by a second bonding layer 18 of metal B. Similarly on the opposite side of the element 1, there is deposited a first bonding layer 17 of metal A onto the adhesion layer 6 followed by a second bonding layer 19 of metal B. Otherwise the embodiments in FIGS. 2d) and 2g) are similar. FIG. 2h) illustrates the same embodiment as FIG. 2g) after arranging the second contact substrate 10 onto the elements 1 and annealing to form the solid interdiffusion bonds, resulting in that the second bonding layers 18, 19 no longer are of metal B, but the intermetallic compound or compounds AB. In addition, there is applied a sealing enclosure 15 to seal off the interior space between the first 9 and second 10 contact substrate.

The final process step according to the first aspect of the invention is depositing a dielectric layer onto the upper surface 13 of the second contact substrate 10 and the lower surface 12 of the first contact substrate 9. The invention according to the first and second aspect may apply any dielectric film known to the person skilled in the art being an effective electric surface passivation, and any known and conceivable method for depositing dielectric films on metal surfaces. Example embodiments of suited dielectric layers include, but are not limited to; chemical vapour deposited films of $SiN_x$, $SiO_x$, $SiC_x$, metal oxides such as alumina, etc. The dielectric layer provides the advantage of electrically insulating the outwardly oriented surfaces of the contact substrates towards the surroundings, and thus enabling applying the contact substrate both as the electrical contact towards the semiconducting thermoelectric conversion material and the thermal contact towards the heat source and the heat sink of the environment at which the thermoelectric half-cell of either p-type conductivity or n-type conductivity of the invention is to be applied. Without the dielectric film towards the surroundings, there is a risk of detrimental electrical shunting currents when two half-cells according to the invention, one of p-type conductivity and the other of n-type conductivity, are serially interconnected to a complete thermoelectric cell and made to contact the same heat source and heat sink. The thickness of the dielectric layer should be sufficient to effectively electrically passivating the outer surface of the contact elements and at the same time sufficiently thin to reduce the thermal resistance across the dielectric layer as much as possible. The thickness of the dielectric layer may vary considerably, depending on which dielectric material being applied. The present invention may thus apply dielectric layers/films having a thickness in one or the following ranges; from 1 nm to 500 µm, from 100 nm to 100 µm, from 500 nm to 50 µm, from 1 to 30 µm, and from 5 to 10 µm. However, in order to reduce the thermal resistance across the dielectric layer, it is advantageous to apply thin dielectric layers. In the case of applying chemical vapour deposited dielectric films of one or more of $SiN_x$, $SiO_x$, $SiC_x$, and metal oxides such as alumina, the dielectric layer may advantageously have a thickness in one of the following ranges: from 1 to 50 nm, from 1 to 30 nm, from 1 to 20 nm, from 5 to 20 nm, and from 5 to 10 nm. FIGS. 2i) and 2j) illustrate the example embodiment shown in FIGS. 2c) and 2g), respectively, after deposition of a dielectric layer onto the first and second contact substrates. As seen on these figures, a first dielectric layer 21 is deposited and covering the upper surface 13 of the second contact substrate 10 and a second dielectric film 22 is deposited onto and covering the lower surface of the first cover substrate 9.

The method according to the first aspect of the invention produces a thermoelectric half-cell of either p-type or n-type electric conductivity. In order to form a functional thermoelectric device it is necessary to interconnect one or more of the thermoelectric half-cells according to the first and second aspect of the invention, preferably in a serially connected chain of half-cells, and forming electric cell contacts at the endpoints of the one or more interconnected thermoelectric half-cells according to the first and second aspect of the invention for harvesting the electric energy being generated when a heat flux flows through the thermoelectric half-cells.

Thus, in a third aspect the present invention relates to a method for producing a thermoelectric cell, wherein the method comprises:

providing a set of N, where N is an integer ϵ[1, n], thermoelectric half-cells made by the method according to any of claims 1-8, and
and if N>1:
  arranging the set of N thermoelectric half-cells in a juxtaposed pattern at a distance apart from each other such that the upper surface of the second contact substrate of each of the thermoelectric half-cells in the set of N thermoelectric half-cells becomes substantially aligned in one single plane and the lower surface of the first contact surface of the thermoelectric half-cells in the set of N cells becomes substantially aligned in another single plane,
  interconnecting the juxtaposed pattern of N thermoelectric half-cells into a chain of serially interconnected thermoelectric half-cells by forming an electric conducting bridge or tip contact between contact substrates of adjacent thermoelectric half-cells in the chain, and
  forming a first cell contact electrically connected to a contact substrate of a first thermoelectric half-cell number 1 of the serially interconnected chain of N thermoelectric half-cells and forming a second cell contact electrically connected to a contact substrate of thermoelectric half-cell number N of the serially interconnected chain of N thermoelectric half-cells,
or if N=1:
  forming a first cell contact electrically connected to the first contact substrate of the thermoelectric half-cell and forming a second cell contact electrically connected to the second contact substrate of the thermoelectric half-cell.

In a fourth aspect, the invention relates to a thermoelectric cell, comprising:
a set of N, where N is an integer ϵ[1, n], thermoelectric half-cells according to any of claims 13-19,
a set of N−1 electric interconnects (20), and
a first (23) and a second (24) cell contact,
wherein
if N>1:
  the set of N thermoelectric half-cells are arranged in a juxtaposed pattern at a distance apart from each other such that the upper surface (13) of the second (10) contact substrate of each of the thermoelectric half-cells in the set of N thermoelectric half-cells becomes substantially aligned in one single plane and the lower surface (12) of the first (9) contact surface of the thermoelectric half-cells in the set of N cells becomes substantially aligned in one single plane,
  the electric interconnects (20) are serially interconnecting the juxtaposed pattern of N thermoelectric half-cells are into a chain of serially interconnected thermoelectric half-cells by forming an electric conducting bridge or tip contact between contact substrates (9, 10) of adjacent thermoelectric half-cells in the chain of serially interconnected thermoelectric half-cells, and
  the first cell contact (23) is electrically connected to a contact substrate (9, 10) of thermoelectric half-cell number 1 of the serially interconnected chain of N thermoelectric half-cells and the second cell contact (24) is electrically connected to a contact substrate (9, 10) of thermoelectric half-cell number N of the serially interconnected chain of N thermoelectric half-cells,
or if N=1:
  the first cell contact (23) is electrically connected to the first contact substrate (9) of the thermoelectric half-cell and the second cell contact (24) is electrically connected to the second contact substrate (10) of thermoelectric half-cell.

The thermoelectric cell may be formed by interconnecting one or more thermoelectric half-cells according to the first and second aspect of the invention having the same conductivity (all thermoelectric half-cells have either n-type or p-type conductivity), or by interconnecting two or more thermoelectric half-cells according to the first and second aspect of the invention at least comprising one thermoelectric half-cell of p-type conductivity and at least one thermoelectric half-cell of n-type conductivity. In the latter case, the thermoelectric half-cells may advantageously be serially interconnected to form a chain of interdigitated alternating thermoelectric half-cells on n-type and p-type conductivity. Furthermore, the invention according to the third and fourth aspect is not bound to strict serial interconnection of the thermoelectric half-cells. It is also envisioned interconnecting two or more thermoelectric half-cells of p-type conductivity and similarly two or more thermoelectric half-cells of n-type conductivity in parallel, and then interconnecting these parallel connected groups of half-cells together in series, or any other combination of parallel and series connection of the thermoelectric half-cells. Any configuration of the thermoelectric half-cells according to the invention satisfying this requirement falls within the scope of the present invention.

The electric interconnection of the thermoelectric half-cells may advantageously be obtained by electrically connecting together contact substrates of thermoelectric half-cells which are to be interconnected. The interconnection of the contact substrates may be obtained in any known and conceivable manner to a person skilled in the art for electrically interconnecting two metal objects. However, since the first and second contact substrate of the thermoelectric half-cells according to the first and second aspect of the invention, is to be applied both as the electric and thermal contact element of the thermoelectric cell according to the third and fourth aspect of the invention, it may be advantageous to make the arrangement of thermoelectric half-cells in a juxtaposed pattern such that the upper surface of the second contact substrate of each of the thermoelectric half-cells in the arrangement becomes aligned in one single plane, and further that the lower surface of the first contact surface of the thermoelectric half-cells in the arrangement becomes aligned in one single plane. By this alignment of the thermoelectric half-cells of the thermoelectric cell, the upper surfaces of the contacts substrates of the arrangement defines a single substantially planar upper contact surface of the thermoelectric cell and similarly a single substantially planar lower contact surface of the thermoelectric cell at the opposite side. With this aligned arrangement of the thermoelectric half-cells of the thermoelectric cell according to the third and fourth aspect of the invention, the interconnection of the thermoelectric half-cells may advantageously be obtained by forming an electric conducting bridge or tip contact extending and in contact with the side surface of both contact substrates that are to be interconnected. The bridge or tip contact may advantageously be made of a metal such as e.g. the metal A of the contact substrate.

A further advantage with the aligned arrangement of the thermoelectric half-cells of the thermoelectric cell according to the third and fourth aspect of the invention, is that the thermoelectric cell according to the third and fourth aspect of the invention may be provided with both mechanical and chemical integrity by filling the space in-between the thermoelectric half-cells of the arrangement by an electrically non-conducting and thermally insulating matrix material. The upper surface of the first contact substrates and the lower surface of the first contact substrates of the thermoelectric half-cells of the arrangement should not be covered by the matrix material (these surfaces are however covered by the dielectric layer to electrically insulate the free surface of the contact substrates). The matrix material should in addition to thermally insulating and electrically non-conductive, also be sufficiently temperature resistant and mechanically resilient to withstand the temperatures and mechanical stresses at which thermoelectric modules/devices encounter during normal operation. Apart from these requirements, any known or conceivable material may be applied in the invention according to the third and fourth aspect. The term "electrically non-conducting" as used herein means that the material has an electric conductivity of less than $10^{-5}$ mho/m, and preferably an electric conductivity typical for dielectric materials of less than $10^{-7}$ mho per/m. The term "thermally insulating" as applied herein, means that the thermal conductivity of the material may advantageously be less than 0.1 W/mK or lower, preferably less than 0.05 W/mK, and more preferably less than 0.03 W/mK. These requirements are not mandatory, but advantageous since the better insulating properties of the matrix material, the less electricity and heat may flow through the matrix material. It is thus also envisioned applying a matrix material having a thermal conductivity above 0.1 W/mK and/or electric conductivity above $10^{-5}$ mho/m. An example of suited matrix material is aerogel or polyurethane. This example embodiment of the present invention has the advantage that the end surfaces with the deposited dielectric layer of the juxtaposed thermoelectric half-cells of the thermoelectric module/device becomes aligned substantially in one single plane at both the first and the second ends of the thermoelectric half-cells, and further that they "protrude" out of the matrix material such that the example embodiment may create electric current by exposing the end surfaces one side to a heat source and the end surfaces at the opposite side to a heat sink.

Figure 3:
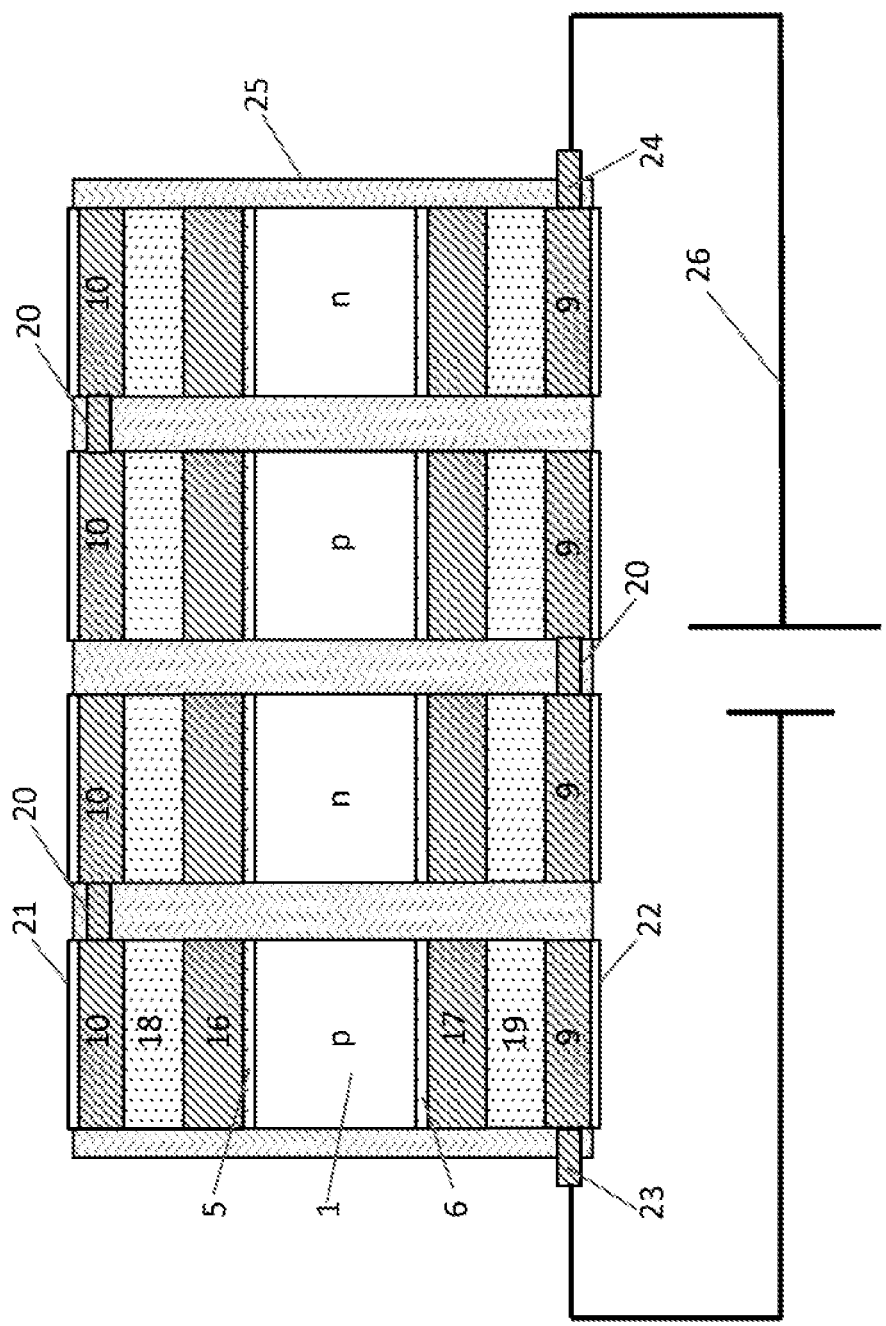

An example embodiment of the invention according to the third and fourth aspect of the invention involving a thermoelectric cell made up of a number of thermoelectric half-cells serially interconnected into a chain of interdigitated alternating thermoelectric half-cells of n-type and p-type conductivity, respectively, is illustrated schematically in FIG. 3a). The figure illustrates an example embodiment of the invention according to the fourth aspect comprising four thermoelectric half-cells according to the second aspect having an ADA-structured adhesion layer followed by a first bonding layer of metal A and a second bonding layer of metal B on both sides of the element of semiconducting thermoelectric conversion material. The combination of ADA-structured adhesion layer and two bonding layers suited for SLID-bonding is shown in greater detail in FIG. 4. FIG. 4 is an enlarged view of the element and its adhesion and bonding layers, enabling illustrating the ADA-structure in more detail. The first adhesion film of the ADA-structure is marked with reference number 30, the diffusion barrier layer of a non-metallic compound is marked with reference number 31, and the second adhesion film of the ADA-structure is marked with reference number 32.

In the example embodiment illustrated in FIG. 3a), reference number 1 denotes an element of semiconducting thermoelectric conversion material of either p-type or n-type conductivity, reference number 5 denotes the first ADA-structured adhesion layer, reference number 6 denotes the second ADA-structured adhesion layer, reference numbers 16 and 17 denote the first bonding layer of metal A, reference number 18 denote the second bonding layer of metal B after formation of the SLID-bonds, i.e. the second layer is no longer of metal B but the intermetallic compound (s) AB. The first contact substrate is marked with reference number 9 and the second contact substrate is marked with reference number 10. Reference numbers 21 and 22 refers to the first and second dielectric layer, respectively. These constituents, i.e. the features marked with reference numbers. 1, 5, 6, 16-19, and 20-21, define one single thermoelectric half-cell according to the second aspect of the invention.

In the example embodiment of FIG. 3a), it is shown an arrangement of a total of four thermoelectric half-cells, two doped to p-type conductivity and two doped to n-type conductivity arranged in an aligned juxtaposed pattern of alternating p- and n-type conductivity. The interconnection of the thermoelectric half-cells into a chain of four series connected half-cells is, in this example embodiment, obtained by an electric interconnect 20 electrically linking the second contact substrate 10 of the first (counted from the left) half-cell to the second contact substrate 10 of the second half-cell in the chain. The first contact substrate 9 of the second half-cell is connected by another electric interconnect 20 to the first contact substrate 9 of the third half-cell in the chain. And finally, the second contact substrate 10 of the third half-cell is connected by another electric interconnect 20 to the second contact substrate 10 of the fourth (i.e. the last) half-cell in the chain. The first contact substrate 9 of the first half-cell in the chain is electrically accessed by a first cell contact 23 and the first contact substrate 9 of the last half-cell in the chain is electrically accessed by a second cell contact 24. The cells contacts 23 and 24 may be connected to an electrical circuit 26 for extraction of electric energy when a heat flux is made to pass through the thermoelectric cell in the vertical direction. The interconnection of the interdigitated juxtaposed pattern of alternating thermoelectric half-cells into a chain of N serially interconnected thermoelectric half-cells in this example embodiment may be generalised as follows:

if N>2:

for each k where k is an integer $\in[1, N-2]$, forming an electric conducting bridge or tip contact between the second contact substrate of thermoelectric half-cell number k and the second contact substrate of thermoelectric half-cell number k+1, and an electric conducting bridge or tip contact between the first contact substrate of thermoelectric half-cell number k+1 and the first contact substrate of thermoelectric half-cell number k+2, or if N=2:

for each k where k is an integer ∈[1], forming an electric conducting bridge or tip contact between the second contact substrate of thermoelectric half-cell number k and the second contact substrate of thermoelectric half-cell number k+1.

In this case, the first cell contact may be electrically connected to the first contact substrate of thermoelectric half-cell number k=1 of the chain of N serially interconnected thermoelectric half-cells, and if N is an even number:

the second cell contact is electrically connected to the first contact substrate of thermoelectric half-cell number N of the chain of N serially interconnected thermoelectric half-cells, or if N is an odd number:

the second cell contact is electrically connected to the second contact substrate of thermoelectric half-cell number N of the chain of N serially interconnected thermoelectric half-cells.

The term "N is an integer ∈[1, n]" as applied herein, means that N is a number which may have be any integer from 1 up to and including the number n. In theory, the thermoelectric cell according to the third or fourth aspect of the invention may comprise any number of interconnected thermoelectric half-cells according to first and second aspect of the invention, such that there is no upper limit to the number n. However, from a practical point of view, the number n is less than 500, preferably less than 200, more preferably less than 100 and most preferred less than 50. The term "chain of N serially interconnected thermoelectric half-cells" as applied herein, means that a number of N thermoelectric half-cells are serially interconnected to each other and forming a series of thermoelectric half-cells connected to each other such that a first thermoelectric half-cell is connected to a second thermoelectric half-cell which, if N>2, is connected to a third thermoelectric half-cell up to and including thermoelectric half-cell number N.

FIG. 3b) illustrates schematically another example embodiment of the thermoelectric cell according to the third and fourth aspect of the invention. This example embodiment is similar example embodiment illustrated in FIG. 3a), except that it is applied a number of three thermoelectric half-cells according to the first and second aspect of the invention each having p-type conductivity (alternatively, each of them have n-type conductivity). In this example embodiment, the interconnection of the thermoelectric half-cells into a chain of series connected half-cells is obtained by an electric interconnect 20 electrically linking the second contact substrate 10 of the first (counted from the left) half-cell to the first contact substrate 9 of the second half-cell in the chain. The second contact substrate 10 of the second half-cell is connected by another electric interconnect 20 to the first contact substrate 9 of the third half-cell in the chain. The first contact substrate 9 of the first half-cell in the chain is electrically accessed by a first cell contact 23 and the second contact substrate 10 of the last half-cell in the chain is electrically accessed by a second cell contact 24. The cells contacts 23 and 24 may be connected to an electrical circuit 26 for extraction of electric energy when a heat flux is made to pass through the thermoelectric cell in the vertical direction. The interconnection of the interdigitated juxtaposed pattern of alternating thermoelectric half-cells into a chain of N serially interconnected thermoelectric half-cells in this example embodiment may be generalised as follows:

the interconnection of the interdigitated juxtaposed pattern of thermoelectric half-cells is obtained by, for each k where k is an integer ∈[1, N−1], forming an electric conducting bridge or tip contact between the second contact substrate of thermoelectric half-cell number k and the first contact substrate of thermoelectric half-cell number k+1.

The arrangement of the thermoelectric half-cells may advantageously be mechanically fixed and stabilised by embedding the juxtaposed arrangement of thermoelectric half-cells in an electrically non-conducting and thermally insulating matrix material 25. As seen on FIGS. 3a) and 3b), the matrix material should advantageously fill the space in-between the thermoelectric half-cells in the arrangement including a distance outside the periphery of the arrangement to ensure a proper mechanical fixture and also a chemical and electrical insulation of the embedded thermoelectric half-cells towards the surroundings. Thus, as illustrated on FIGS. 3a) and 3b), the matrix material 25 may advantageously embed all of the half-cells in the arrangement except for the upper surface and the dielectric layer 21 of the second contact substrate 10 and similarly the lower surface and the dielectric layer 22 of the first contact substrate 9 of each thermoelectric half-cell in the arrangement.

LIST OF FIGURES

FIG. 1a) is a schematic side view illustrating typical prior art structure of a thermoelectric device involving one p-doped and one n-doped element of thermoelectric conversion material.

FIG. 1b) is a facsimile of FIG. 1 of U.S. Pat. No. 6,660,926 showing a schematic representation of the crystal structure of the mineral skutterudite.

FIGS. 2a)-2b), 2d), 2f)-2h), and 2j) are cut side views schematically illustrating different process stages of the method for forming a thermoelectric half-cell according to the first aspect of the invention:

FIG. 2a) illustrates an example embodiment of a single element of a semiconducting thermoelectric conversion material doped to doped either to p-type or n-type conductivity.

FIG. 2b) illustrates the same example embodiment as shown in FIG. 2a) after deposition of the adhesion layers.

FIG. 2c) illustrates an example embodiment not part of the invention where one element as shown in FIG. 2b) is being provided with the contact substrates.

FIG. 2d) illustrates the same process step as shown in FIG. 2c) applied for an example embodiment of the invention employing four of the elements as shown in FIG. 2b).

FIG. 2e) illustrates the same embodiment not part of the invention as shown in FIG. 2c) after attaching the contact substrates and applying a sealing enclosure.

FIG. 2f) illustrates the same embodiment of the invention as shown in FIG. 2d) after attaching the contact substrates and applying a sealing enclosure.

FIG. 2g) illustrates the same process step as shown in FIG. 2c) when applied on an example embodiment of the invention in the case of employing four of the elements as shown in FIG. 2b) further comprising two metallic contact layers for formation of a SLID-bonding being provided with the contact substrates.

FIG. 2h) illustrates the same embodiment of the invention as shown in FIG. 2g) after attaching the contact substrates, performing the annealing to form the SLID-bonding, and applying a sealing enclosure.

FIG. 2i) illustrates the same embodiment not part of the invention as shown in FIG. 2c) after attaching the contact substrates and formation of the dielectric layers.

FIG. 2*j*) illustrates the same embodiment of the invention as shown in FIG. 2*h*) after formation of the dielectric layers.

FIG. 3*a*) is a cut side view schematically illustrating an example embodiment of the invention according to the fourth aspect.

FIG. 3*b*) is a cut side view schematically illustrating another example embodiment of the invention according to the fourth aspect.

FIG. 4 is a cut side view schematically illustrating an example embodiment of the ADA/SLID-structure.

EXAMPLE EMBODIMENT OF THE INVENTION

The invention is described in more detail by way of an example embodiment of a thermoelectric cell according to the first, second, third and fourth aspect of the invention.

The example embodiment utilises a filled or non-filled $CoSb_3$-based skutterudite as the semiconducting thermoelectric conversion material intended to operate at high temperatures, i.e. at temperatures in the range from about 0° C. up to about 800° C. Each element in the example embodiment is provided with the ADA-structured adhesion layer and the contact substrates are bonded to the element including the ADA-structured adhesion layer by a SLID-bonding. Both the first and the second adhesion film of the ADA-structure is made of one of Cr, Ta or Ti. An especially preferred embodiment is Ti of at least 99.5 weight % pure Ti. The diffusion barrier layer is a nitride of the same metal as employed in the adhesion films. Thus, the especially preferred ADA-structure comprises a first adhesion film of Ti of at least 99.5 weight % pure Ti, a diffusion barrier layer of TiN, and a second adhesion film of Ti of at least 99.5 weight % pure Ti.

Further, both the first bonding layer of metal A and the contact substrates in the example embodiment are made of one of; Au, Ag, Cu, Ni, a Ni—V alloy with from 6.5 to 7.5 atomic % V, or a Ni—P alloy with from 5 to 12 weight % P, and metal B is one of; In or Sn. In an especially preferred embodiment the metal A of both the first bonding layer and the contact substrates is Ni or a Ni—V alloy with from 6.5 to 7.5 atomic % V, and the metal B of the second bonding layer in the especially preferred example embodiment is Sn. The thicknesses of the layers of the example embodiment may be:

the thickness of the first adhesion film in the ADA-structure is in one of the following ranges; from 20 nm to 2 µm, from 50 nm to 1.5 µm, from 100 nm to 1.5 µm, from 200 nm to 1.5 µm, or from 500 nm to 1.5 µm, the thickness of the diffusion barrier layer in the ADA-structure is in one of the following ranges: from, 50 to 5000 nm, from 75 to 3000 nm, from 100 to 2000 nm, from 150 to 1000 nm, from 150 to 750 nm, from 200 to 500 nm, from 200 to 400 nm or from 200 to 300 nm, the thickness of the second adhesion film in the ADA-structure is in one of the following ranges; from 20 nm to 1000 nm, from 30 nm to 750 nm, from 40 nm to 500 nm, from 100 nm to 400 nm, or from 150 nm to 300 nm, the thickness of the first bonding layer of metal A is in one of the following ranges; from 1 µm to 1 cm, from 1 µm to 0.5 cm, from 1 µm to 0.1 cm, from 2 µm to 500 µm, from 2 µm to 100 µm, from 2 µm to 50 µm, or from 3 µm to 10 µm, and the thickness of the second bonding layer of metal B is in one of the following ranges; from 300 nm to 0.75 cm, 300 nm to 0.3 cm, 300 nm to 750 µm, from 200 nm to 400 µm, from 200 nm to 75 µm, from 200 nm to 30 µm, or from 300 nm to 3 µm.

The combination of employing an adhesion film of pure Ti having a more than 99.5% purity based on the total weight of the Ti-phase, a diffusion barrier layer of TiN and a contact layer of Ni has proven to provide an especially robust metallisation exhibiting excellent electric and thermal conductivities of $CoSb_3$-based skutterudite thermoelectric conversion materials, which may easily and securely be bonded to the contact substrates of the thermoelectric half-cell by use of the SLID-technology. That is, the contact substrates may be bonded to the $CoSb_3$-based skutterudite thermoelectric conversion material by depositing a contact layer of Ni and then a bonding layer of Sn on the electrode, and then bonding them together by pressing the bonding layers of Sn together and heating them until the Sn reacts with the Ni and forms one or more of the following intermetallic compounds; $Ni_3Sn$, $Ni_3Sn_2$, or $Ni_3Sn_4$.

The deposition of the ADA-structure and the first and second bonding layers may advantageously be obtained by the following process steps:

employing more than one element of a n-type or p-type doped semiconducting thermoelectric conversion material of a filled or non-filled $CoSb_3$-based skutterudite having a first and second surface on opposite sides, placing the more than one element of semiconducting thermoelectric conversion material into a deposition chamber, and then:

i) depositing a first adhesion film of a first metal directly onto the first and the second surface of the elements of the semiconducting thermoelectric conversion material, ii) depositing a diffusion barrier layer of a non-metallic compound of a second metal directly onto the first adhesion film on the first and second surface of the semiconducting thermoelectric conversion material elements, iii) depositing a second adhesion film of a third metal directly onto the diffusion barrier layer of the non-metallic compound of the second metal on the first and second surface of the elements of the semiconducting thermoelectric conversion material, iv) depositing a first bonding layer of a metal A directly onto the second adhesion film on the first and second surface of element of the semiconducting thermoelectric conversion material, and v) depositing a second bonding layer of a metal B directly onto the first bonding layer the on the first and second surface of the element of the semiconducting thermoelectric conversion material, wherein the deposition chamber is either a chemical vapour deposition chamber, a physical deposition chamber, or an atomic deposition chamber, and the deposition of the different layers of steps i) to v) is obtained by feeding pre-cursor gases with varying chemical composition into the deposition chamber, the non-metallic compound of the second metal is either a nitride or an oxide of the second metal, and the melting point of metal A is higher than metal B and metal B is chemically reactive towards metal A at their common interface when subject to heating above the melting point of metal B forming an intermetallic compound by solid-liquid interdiffusion.

The inventor has discovered that the bonding strength and the electric and thermal conductivity of the layers forming the metallisation structure may be significantly improved by practically avoiding any oxidation of the metal phases (Ti, Ni or Sn) during and after deposition. That is, the deposition process should advantageously be performed in a protected atmosphere practically void of oxygen (i.e. having less than 50 ppm oxygen) or made under a vacuum (i.e. at a pressure of less than 1000 Pa). Alternatively, if the handling of the thermoelectric material after formation of the metallisation involves exposure to air/oxygen, the metallic surfaces deposition proves may include depositing 10 to 50 nm of Au on top of the metal layer as an oxidation resistance layer. The oxidation resistance layer may be applied onto either the Ti layer (the adhesion layer), the contact layer (Ni) or the bonding layer (Sn), or one two or more of these.

REFERENCES

1. S. Bader, W. Gust, and H. Hieber (1994), "Rapid Formation of Intermetallic Compounds by Interdiffusion in the Cu—Sn and Ni—Sn Systems", *Acta metall. mater.*, Vol. 43, No. 1, pp. 329-337.

The invention claimed is:
1. A thermoelectric half-cell, comprising:
more than one element of a semiconducting thermoelectric conversion material (1), where all of the more than one elements of a semiconducting thermoelectric conversion material (1) are doped to p-type conductivity or all of the more than one elements of a semiconducting thermoelectric conversion materials (1) are doped to n-type conductivity, and wherein each of the more than one elements has a side surface (2) and a first end surface (3) and a second end surface (4) at two opposite sides which are substantially mutually parallel to each other, planar, and perpendicular to the side surface (2), and wherein the first end surface (3) of all of the more than one elements of a semiconducting thermoelectric conversion materials (1) are electrically connected together in parallel and the second end surface (4) of all of the more than one elements of a semiconducting thermoelectric conversion materials (1) are electrically connected together in parallel, and wherein:
  a first adhesion layer (5) is deposited onto the first end surface (3) of each of the more than one element of a semiconducting thermoelectric conversion material (1), and
  a second adhesion layer (6) is deposited onto the second end surface (4) of each of the more than one element of a semiconducting thermoelectric conversion material (1),
a first (9) and a second (10) contact substrate made of a metal A, where each of the first and second contact substrates have a substantially planer upper surface (11, 13) and a substantially planar lower surface (12, 14) being mutually opposite and substantially parallel,
a first dielectric layer (21) deposited and covering the entire upper surface (13) of the second contact substrate (10),
a second dielectric layer (22) deposited and covering the entire lower surface (12) of the first contact substrate (9), and
a gas tight sealing enclosure (15) extending from at least the upper surface (11) of the first contact substrate (9) to at least the lower surface (14) of the second contact substrate (10) and along the entire periphery of the first (9) and the second (10) contact substrate, wherein the gas tight sealing enclosure (15) is made of glass frit or metal and protects the semiconducting thermoelectric conversion material (1) from ambient oxygen,
and wherein:
each of the more than one element of a semiconducting thermoelectric material (1) is arranged at a distance from each other in between the first (9) and the second (10) contact substrate such that:
  one of the first (5) or second (6) adhesion layer is facing and in electric and thermal contact with the lower surface (14) of the second contact substrate (10), and
  the other of the first (5) or second (6) adhesion layer not in contact with the second contact substrate (10), is facing and in electric and thermal contact with the upper surface (11) of the first contact substrate (9),
wherein each of the first (5) and the second (6) adhesion layers comprises a structure of:
  an inner adhesion layer (30) of a first metal laid directly on the first (3) and the second (4) end surface of the more than one element of a semiconducting thermoelectric conversion material (1),
  a diffusion barrier layer (31) of a non-metallic compound of a second metal laid directly onto the inner adhesion layer (30), and
  an outer adhesion layer (32) of a third metal laid directly onto the diffusion barrier layer (31),
and wherein
  the first metal of the inner adhesion layer (30) and the third metal of the outer adhesion layer (32) comprise a metal selected from the group consisting of Cr, Cu, Sn, Ta, and Ti, and the non-metallic compound of the second metal of the diffusion barrier layer (31) is a nitride or an oxide of a metal selected from the group consisting of Cr, Cu, Sn, Ta, and Ti,
  the thickness of the inner adhesion layer (30) is from 30 nm to 100 μm,
  the thickness of the diffusion barrier layer (31) is from 50 to 5000 nm, and
  the thickness of the outer adhesion layer (32) is from 20 nm to 100 μm, and
wherein the more than one element of a semiconducting thermoelectric conversion material (1) is selected from the group consisting of: a filled $CoSb_3$-based skutterudite doped to p-type or n-type conductivity, a non-filled $CoSb_3$-based skutterudite doped to p-type or n-type conductivity, a filled silicide based thermoelectric material of $Mg_2Si$ or $MnSi_{1.7}$, and a non-filled silicide based thermoelectric material of $Mg_2Si$ or $MnSi_{1.7}$.

2. The thermoelectric half-cell according to claim 1, wherein the thermoelectric half-cell further comprises:
  a solid-liquid interdiffusion bond formed between a first bonding layer (16) of the metal A laid directly onto the first adhesion layer (5), a second bonding layer (18) of the metal B laid directly onto the first bonding layer (16), and the second contact substrate (10) made of the metal A, and
  a solid-liquid interdiffusion bond formed between a first bonding layer (17) of the metal A laid directly onto the second adhesion layer (6), a second bonding layer (19) of the metal B laid directly onto the first bonding layer (17), and the first contact substrate (9) made of the metal A, and wherein:
  i) the metal A and metal B are selected from the group consisting of the following metal pairs where the metal A is given first and the metal B is given last: Au—In, Au—Sn, Ag—In, Ag—Sn, Cu—Sn, and Ni—Sn, ii) the solid-liquid interdiffusion bond is obtained by pressing the contact substrates (9, 10) to mechanical contact with their second bonding layers (17, 19), respectively, and annealing at a temperature at which the metal B of the second bonding layer (19, 17) reacts with the metal A of the first bonding layer (16, 17) and the contact substrates (9, 10) to form at least one solid intermetallic compound AB,
the initial thickness of the first bonding layer (16, 17) is from 1 μm to 1 cm, and
the initial thickness of the second bonding layer (17, 19) is from 300 nm to 0.75 cm.

3. The thermoelectric half-cell according claim 2, wherein the thermoelectric half-cell further comprises a 10 to 50 nm thick layer of Au laid directly onto one of the first adhesion layer (5), the second adhesion layer, (6) or the first bonding layer (16, 17), or two or more of these.

4. The thermoelectric half-cell according to claim 1, wherein the first metal and the third metal of the structure is Ti of at least 99.5 weight % purity, the non-metallic compound of the second metal of the diffusion barrier layer is TiN, the metal A of the first bonding layer is Ni and the metal B of the second bonding layer is Sn.

5. A thermoelectric cell, comprising:
a set of N, where N is an integer $\epsilon$ [1, n], thermoelectric half-cells according to claim 1,
a set of N−1 electric interconnects (20), and
a first (23) and a second (24) cell contact,
wherein
if N>1:
the set of N thermoelectric half-cells are arranged in a juxtaposed pattern at a distance apart from each other such that the upper surface (13) of the second (10) contact substrate of each of the thermoelectric half-cells in the set of N thermoelectric half-cells becomes substantially aligned in one single plane and the lower surface (12) of the first (9) contact surface of the thermoelectric half-cells in the set of N cells becomes substantially aligned in one single plane,
the electric interconnects (20) are serially interconnecting the juxtaposed pattern of N thermoelectric half-cells into a chain of serially interconnected thermoelectric half-cells by forming an electric conducting bridge or tip contact between contact substrates (9, 10) of adjacent thermoelectric half-cells in the chain of serially interconnected thermoelectric half-cells, and
the first cell contact (23) is electrically connected to a contact substrate (9, 10) of thermoelectric half-cell number 1 of the serially interconnected chain of N thermoelectric half-cells and the second cell contact (24) is electrically connected to a contact substrate (9, 10) of thermoelectric half-cell number N of the serially interconnected chain of N thermoelectric half-cells,
or if N=1:
the first cell contact (23) is electrically connected to the first contact substrate (9) of the thermoelectric half-cell and the second cell contact (24) is electrically connected to the second contact substrate (10) of thermoelectric half-cell.

6. A thermoelectric cell comprising:
a set of N−1 electric interconnects (20),
a first (23) and a second (24) cell contact, and
a set of N, where N is an integer $\epsilon$ [2, n], thermoelectric half-cells according to claim 1 of which at least one thermoelectric half-cell has p-type conductivity and at least one thermoelectric half-cell has n-type conductivity,
wherein:
the set of N thermoelectric half-cells are arranged into a juxtaposed interdigitated pattern of alternating thermoelectric half-cells of p-type and n-type conductivity, and
the interdigitated juxtaposed pattern of alternating thermoelectric half-cells into a chain of N serially interconnected thermoelectric half-cells is obtained by:
if N>2:
for each k where k is an integer $\epsilon$[1, N−2], the electric interconnects (20) form an electric conducting bridge or tip contact between the second (10) contact substrate of thermoelectric half-cell number k and the second (10) contact substrate of thermoelectric half-cell number k+1, and an electric conducting bridge or tip contact between the first (9) contact substrate of thermoelectric half-cell number k+1 and the first (9) contact substrate of thermoelectric half-cell number k+2,
or if N=2:
for each k where k is an integer $\epsilon$ [1], the electric interconnects (20) form an electric conducting bridge or tip contact between the second (10) contact substrate of thermoelectric half-cell number k and the second (10) contact substrate of thermoelectric half-cell number k+1, and
the first cell contact (23) is electrically connected to the first (9) contact substrate of thermoelectric half-cell number k=1 of the chain of N serially interconnected thermoelectric half-cells, and
if N is an even number:
the second cell contact (24) is electrically connected to the first (9) contact substrate of thermoelectric half-cell number N of the chain of N serially interconnected thermoelectric half-cells,
or if N is an odd number:
the second cell contact (24) is electrically connected to the second (10) contact substrate of thermoelectric half-cell number N of the chain of N serially interconnected thermoelectric half-cells.

7. The thermoelectric cell according to claim 5, wherein:
the set of N thermoelectric half-cells comprises at least two thermoelectric half-cells of either only p-type conductivity or only n-type conductivity,
for each k where k is an integer $\epsilon$ [1, N−1], the electric interconnects (20) form an electric conducting bridge or tip contact between the second (10) contact substrate of thermoelectric half-cell number k and the first (9) contact substrate of thermoelectric half-cell number k+1,
the first cell contact (23) is electrically connected to the first contact substrate (9) of thermoelectric half-cell number k=1, and
the second cell contact (24) is electrically connected to the second (10) contact substrate of thermoelectric half-cell number N of the chain of N serially interconnected thermoelectric half-cells.

8. The thermoelectric cell according to claim 5, wherein:
the set of N thermoelectric half-cells further comprises an electrically non-conducting and thermally insulating matrix material (25) selected from the group consisting of aerogel and polyurethane, and
if N>1:

the thermally insulating matrix material (25) fills the space in-between the thermoelectric half-cells arranged in the juxtaposed pattern including a distance outside a periphery of the thermoelectric half-cells arranged in the juxtaposed pattern such that the first dielectric layer (21) and second dielectric layer (22) on the first contact substrate (9) and second contract substrate (10) of the thermoelectric half-cells arranged in the juxtaposed pattern are exposed to the surroundings, or if N=1:

the thermally insulating matrix material (25) encapsulates the side surface (2) of the thermoelectric half-cells such that the first dielectric layer (21) and second dielectric layer (22) on the first contact substrate (9) and second contract substrate (10) of the thermoelectric half-cells are exposed to the surroundings.

9. The thermoelectric half-cell according to claim 1, wherein the thickness of the inner adhesion layer (30) is from 200 nm to 10 μm, the thickness of the diffusion barrier layer (31) is from 150 nm to 750 nm, and the thickness of the outer adhesion layer (32) is from 30 nm to 100 μm.

10. The thermoelectric half-cell according to claim 1, wherein the thickness of the inner adhesion layer (30) is from 500 nm to 1 μm, the thickness of the diffusion barrier layer (31) is from 200 nm to 300 nm, and the thickness of the outer adhesion layer (32) is from 500 nm to 1 μm.

11. The thermoelectric half-cell according to claim 2, wherein the initial thickness of the first bonding layer (16, 17) is from 3 μm to 10 μm, and the initial thickness of the second bonding layer (17, 19) is from 300 nm to 3 μm.

12. The thermoelectric half-cell according to claim 2, wherein the initial thickness of the first bonding layer (16, 17) is from 2 μm to 500 μm, and the initial thickness of the second bonding layer (17, 19) is from 300 nm to 400 μm.

* * * * *